United States Patent [19]

Takahashi

[11] Patent Number: 5,691,802
[45] Date of Patent: Nov. 25, 1997

[54] CATADIOPTRIC OPTICAL SYSTEM AND EXPOSURE APPARATUS HAVING THE SAME

[75] Inventor: Tomowaki Takahashi, Yokohama, Japan

[73] Assignee: Nikon Corporation, Japan

[21] Appl. No.: 552,453

[22] Filed: Nov. 3, 1995

[30] Foreign Application Priority Data

Nov. 7, 1994 [JP] Japan ............................ 6-271631
Mar. 7, 1995 [JP] Japan ............................ 7-047142
Jul. 14, 1995 [JP] Japan ............................ 7-177858

[51] Int. Cl.⁶ .................................................. G03B 27/42
[52] U.S. Cl. ........................ 355/53; 355/77; 355/60; 355/43; 359/727; 359/730; 359/366
[58] Field of Search ........................ 355/53, 71, 43, 355/77, 57, 60; 359/366, 727, 730, 731

[56] References Cited

U.S. PATENT DOCUMENTS

| | | | |
|---|---|---|---|
| 3,917,399 | 11/1975 | Buzawa et al. | 355/43 |
| 4,669,866 | 6/1987 | Phillips | 355/53 X |
| 4,704,027 | 11/1987 | Phillips | 355/53 X |
| 4,742,376 | 5/1988 | Phillips | 355/77 |
| 4,779,966 | 10/1988 | Friedman | 350/442 |
| 5,052,763 | 10/1991 | Singh et al. | 359/355 |
| 5,274,420 | 12/1993 | Chastang | 355/53 X |
| 5,303,001 | 4/1994 | Jeong et al. | 355/53 |
| 5,402,205 | 3/1995 | Markle et al. | 355/53 |
| 5,467,166 | 11/1995 | Shiraishi | 355/71 |

*Primary Examiner*—R. L. Moses
*Attorney, Agent, or Firm*—Pennie & Edmonds LLP

[57] ABSTRACT

It is an object of the invention to provide a catadioptric optical system with an arrangement for realizing a large numerical aperture and reducing the diameter of a concave mirror while ensuring a sufficient working distance on the image side, and also an exposure apparatus using this catadioptric optical system.

A catadioptric optical system according to the invention includes a first imaging optical system for forming an intermediate image of a pattern on a first plane, a second imaging optical system for forming a reduced image of the intermediate image on a second plane, and an optical path deflecting member for guiding a light beam from the first imaging optical system to the second imaging optical system. The first imaging optical system has at least a first optical element group having a positive refracting power, and a second optical element group having a concave mirror and a meniscus lens component with a concave surface facing the first imaging optical system. In particular, the first optical element group having a positive refracting power is arranged to guide a light beam from the first plane to the second optical element group.

35 Claims, 20 Drawing Sheets

SPHERICAL ABERRATION

ASTIGMATISM

DISTORTION

CHROMATIC ABERRATION OF MAGNIFICATION

TRANSVERSE
ABERRATION

TRANSVERSE
ABERRATION

TRANSVERSE
ABERRATION

TRANSVERSE
ABERRATION

TRANSVERSE
ABERRATION

FIG.19A  FIG.19B  FIG.19C
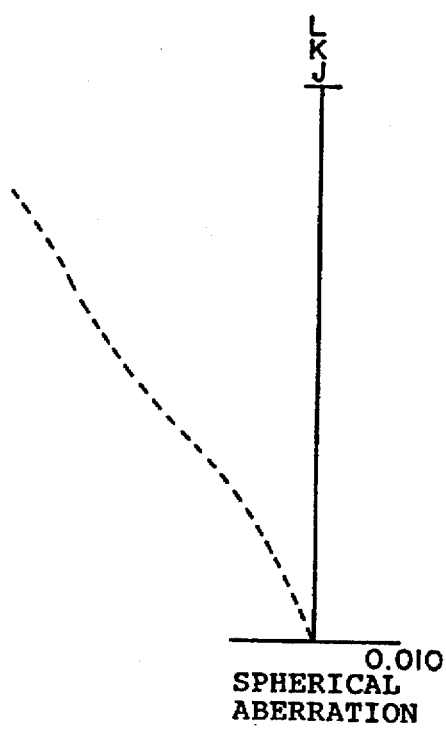
SPHERICAL ABERRATION
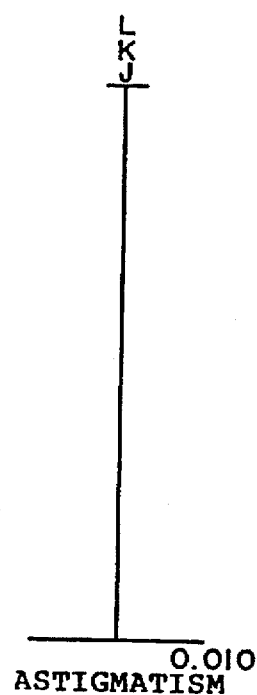
ASTIGMATISM
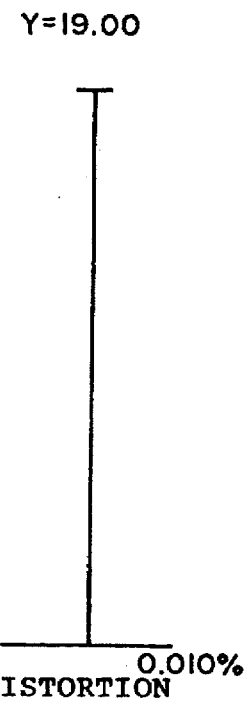
DISTORTION
FIG.20
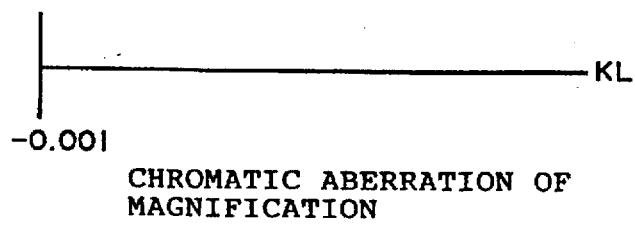
CHROMATIC ABERRATION OF MAGNIFICATION

TRANSVERSE ABERRATION

TRANSVERSE ABERRATION

TRANSVERSE ABERRATION

TRANSVERSE ABERRATION

TRANSVERSE ABERRATION

FIG.24A  FIG.24B  FIG.24C
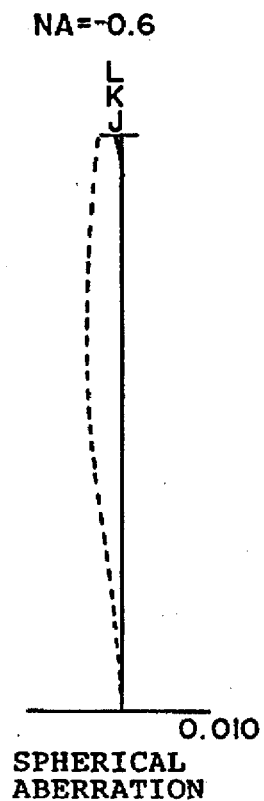
SPHERICAL ABERRATION
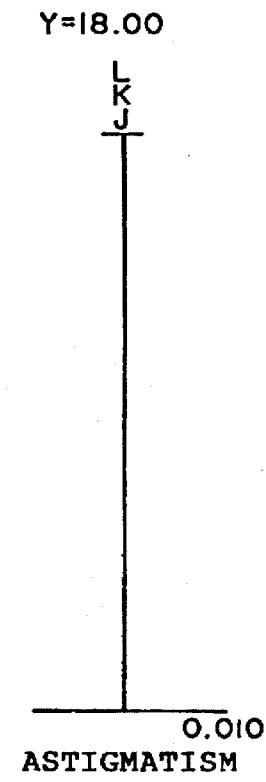
ASTIGMATISM
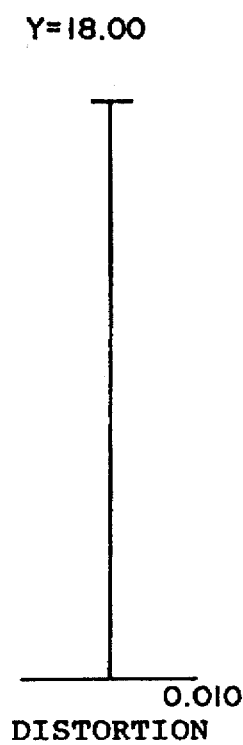
DISTORTION
FIG.25
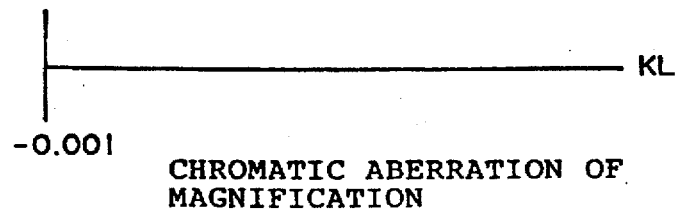
CHROMATIC ABERRATION OF MAGNIFICATION

TRANSVERSE
ABERRATION

TRANSVERSE
ABERRATION

TRANSVERSE
ABERRATION

TRANSVERSE
ABERRATION

TRANSVERSE
ABERRATION

NA=-0.6

0.010
SPHERICAL
ABERRATION

Y=17.02

0.500
ASTIGMATISM

Y=17.02

10.000
DISTORTION

-0.001

CHROMATIC ABERRATION OF
MAGNIFICATION

TRANSVERSE ABERRATION

TRANSVERSE ABERRATION

TRANSVERSE ABERRATION

TRANSVERSE ABERRATION

TRANSVERSE ABERRATION

CATADIOPTRIC OPTICAL SYSTEM AND EXPOSURE APPARATUS HAVING THE SAME

BACKGROUND OF THE INVENTION

1. Field of the Invention

The present invention relates to a projection optical system in a projection exposure apparatus such as a stepper used to manufacture semiconductor elements or liquid crystal display elements by photolithography and, more particularly, to a catadioptric projection optical system using a reflection system as an element of an optical system.

2. Related Background Art

In photolithography for manufacturing semiconductor elements, liquid crystal display elements, or the like, a projection exposure apparatus which reduces the pattern image of a reticle (or a photomask) to about ¼ to ⅕ through a projection optical system and exposures the pattern image onto a wafer or a glass plate (to be referred to as a photosensitive substrate hereinafter) coated with a photoresist or the like is used. As a projection exposure apparatus, a one-shot exposure apparatus such as a stepper is conventionally used.

Recently, as the degree of integration of a semiconductor element or the like is improved, a resolving power required for a projection optical system used in a projection exposure apparatus is also increasing. To cope with this requirement, the wavelength of illumination light for exposure (exposure wavelength) must be shortened, or the numerical aperture NA of the projection optical system must be increased. However, when the exposure wavelength is shortened, only limited types of optical glass materials can be practically used because of the absorption of illumination light. For this reason, it is difficult to form a projection optical system using only a refraction system.

On the other hand, a projection optical system constituted by only a reflection system has also been examined. In this case, however, the projection optical system becomes bulky. Additionally, the reflecting surface must be made aspherical, though it is very difficult to precisely manufacture an aspherical surface in a large size.

Therefore, various techniques of forming a reduction projection optical system by a so-called catadioptric optical system consisting of a reflection system and a refraction system formed of an optical glass material having a resistance against the to-be-used exposure wavelength are proposed. For example, a catadioptric optical system for projecting an image of a reticle at a predetermined reduction magnification by combining an optical system including a concave mirror and a refraction optical system is disclosed in, e.g., U.S. Pat. No. 4,779,966, and Japanese Patent Laid-Open No. 4-234722.

A catadioptric optical system disclosed in U.S. Pat. No. 4,779,966 comprises, in the following order from the object side, a refraction optical system, and a catadioptric optical system for refocusing an intermediate image formed by this refraction optical system.

An optical system disclosed in Japanese Patent Laid-Open No. 4-234722 comprises, in the following order from the object side, a perfectly symmetrical type catadioptric optical system, and a refraction optical system for refocusing an intermediate image formed by this catadioptric optical system at a reduction magnification.

The catadioptric optical system disclosed in U.S. Pat. No. 4,779,966 or Japanese Patent Laid-Open No. 4-234722 uses only a lens component having a negative power as a refraction optical member in the catadioptric optical system including a concave mirror. Therefore, the diameter of a light beam from an object (intermediate image) to the concave mirror only increases, so the diameter of the concave mirror itself cannot be reduced.

Additionally, in the catadioptric optical system disclosed in U.S. Pat. No. 4,779,966, when the numerical aperture on the image side (substrate side) is to be increased, the numerical aperture of an optical system close to the image side must be increased. At this time, the diameter of a light beam incident on the concave mirror in the catadioptric optical system arranged on the image side must be increased. As a result, the diameter of the concave mirror increases. Furthermore, since the catadioptric optical system disclosed in U.S. Pat. No. 4,779,966 is an optical system having a reduction magnification, the optical path from the concave reflecting mirror to the image plane on a photosensitive substrate cannot be made long. The number of refraction lenses arranged in this optical path cannot be increased, so sufficient imaging performance is hardly obtained. Furthermore, the distance between the end face of an optical element closest to the substrate side and the substrate surface (image plane), i.e., a sufficient working distance on the substrate side cannot be ensured.

SUMMARY OF THE INVENTION

It is an object of the present invention to obtain a catadioptric optical system with an arrangement for realizing a large numerical aperture and reducing the diameter of a concave mirror while ensuring a sufficient working distance on the image side, and also an exposure apparatus using this catadioptric optical system. The catadioptric optical system according to the present invention can be applied to both a one-shot exposure apparatus and a scanning exposure apparatus.

In order to achieve the above object, according to the present invention, there is provided a reflection exposure apparatus comprising at least a first stage 3 (wafer stage) capable of holding a photosensitive substrate W on a major surface thereof, a second stage 2 (reticle stage) for holding a mask (reticle R) having a predetermined pattern, an illumination optical system 1 for emitting an exposure light beam having a predetermined wavelength to the mask and transferring an image of the predetermined pattern on the mask onto the substrate, and a catadioptric optical system according to the present invention, which is arranged between the first stage 3 and the second stage 2 to project the pattern formed on a first plane P1 (object plane) on the mask onto a second plane P2 (image plane) on the substrate, as shown in FIGS. 1 and 2. Note that the photosensitive substrate W consists of an exposure target 8 such as a glass plate, silicon wafer, or the like, and a photosensitive material 7 such as a photoresist coated on the surface of the exposure target 8.

The catadioptric optical system comprises a first imaging optical system $G_1$ for forming an intermediate image (primary image) of the pattern on the mask, a second imaging optical system $G_2$ having a reduction magnification and adapted to form a reduced image (secondary image) of the intermediate image formed by the first imaging optical system $G_1$ on the substrate (the composite magnification of the second imaging optical system $G_2$ and the first imaging optical system $G_1$ is a reduction magnification), and a first optical path deflecting member $M_2$ arranged in the optical path from the first imaging optical system $G_1$ to the second imaging optical system $G_2$ to guide a light beam from the first imaging optical system $G_1$ to the second imaging optical system $G_2$, as shown in FIG. 3.

The first imaging optical system $G_1$ comprises a first optical element group $G_{11}$ having a positive refracting power, and a second optical element group $G_{12}$ consisting of a negative lens component and a concave mirror $M_1$ and having a positive refracting power. Each element constituting the first imaging optical system $G_1$ is arranged such that a light beam from the mask passes through the first optical element group $G_{11}$ and reaches the concave mirror $M_1$ in the second optical element group $G_{12}$, and the light beam reflected by the concave mirror $M_1$ passes through the first optical element group $G_{11}$ again and reaches the first optical path deflecting member $M_2$. The second imaging optical system $G_2$ comprises a front optical element group $G_{21}$ having a positive refracting power, and a rear optical element group $G_{22}$ having a positive refracting power. In particular, a light beam from the first imaging optical system $G_1$ sequentially passes through the front optical element group $G_{21}$ and the rear optical element group $G_{22}$ and reaches the second plane P2 (image plane) on the substrate.

The first imaging optical system $G_1$ in the catadioptric optical system may further comprise a third optical element group $G_{13}$ arranged in the optical path between the first plane P1 and the first optical element group $G_{11}$. In this case, the third optical element group $G_{13}$ comprises a forward lens group $G_{13F}$ having a positive refracting power and a rear lens group $G_{13R}$ having a negative refracting power, in this order from the first plane P1 to the first optical element group $G_{11}$.

To minimize the number of optical elements susceptible to asymmetric deformation due to gravity, the catadioptric optical system is preferably arranged in the exposure apparatus such that at least the propagation direction of an exposure light beam irradiated from the illumination optical system 1 and passing through the mask and the propagation direction of an exposure light beam emerging from the second imaging optical system toward the substrate W coincides with the direction of gravity while arranging the first plane P1 (object plane) on the mask and the second plane (image plane) on the substrate in parallel to each other. As an aspect for obtaining this arrangement, a second optical path deflecting member $M_0$ for changing the propagation direction of a light beam from the first plane P1 (object plane) can be arranged between the first plane P1 and the first optical path deflecting member $M_2$, thereby arranging the first plane P1 and the second plane P2 (image plane) in parallel to each other, as shown in FIG. 6. As shown in FIG. 9, even when a third optical path deflecting member $M_3$ for changing the propagation direction of a light beam from the front optical element group $G_{21}$ in the second imaging optical system $G_2$ is arranged between the front optical element group $G_{21}$ and the rear optical element group $G_{22}$, the first plane P1 and the second plane P2 become to be arranged in parallel to each other. In FIG. 6, the lower side of the drawing corresponds to the lower side of the exposure apparatus, and the upper side of the drawing corresponds to the upper side of the exposure apparatus.

According to the present invention with the above arrangement, a light beam from the first plane P1 reaches the second optical element group $G_{12}$ including the concave mirror $M_1$ via the first optical element group $G_{11}$ having a positive refracting power in the first imaging optical system $G_1$. For this reason, the diameter of the light beam reaching the second optical element group $G_{12}$ can be reduced by the first optical element group $G_{11}$. Therefore, the diameter of the concave mirror $M_1$ in the second optical element group $G_{12}$ can be reduced. Reduction of the diameter of the concave mirror $M_1$ facilitates to precisely manufacture the concave mirror $M_1$ and also reduces the manufacturing cost.

In addition, according to the present invention, an intermediate image (primary image) is formed, and the first imaging optical system $G_1$ has the concave mirror $M_1$ and the negative lens component. With this arrangement, chromatic aberration can be minimized. Particularly, when the present invention is applied using a krypton fluoride (KrF) excimer laser or an argon fluoride (ArF) excimer laser with a large oscillation wavelength width as a light source, chromatic aberration can be advantageously minimized.

Furthermore according to the present invention, in the optical path from the first imaging optical system $G_1$ to the second imaging optical system $G_2$, the diameter of the light beam is reduced by the first imaging optical system $G_1$. For this reason, size reduction of the first optical path deflecting member $M_2$ itself arranged in this optical path can be achieved.

Furthermore, according to the present invention, the first optical path deflecting member $M_2$ is preferably constituted by a member having only a function of deflecting the optical path. Such a member need not have a function of splitting a light beam, unlike a beam splitter. Therefore, the loss in light amount can be suppressed to almost 0%, and flare light can also be advantageously minimized. In the present invention, an aberration caused by nonuniformity in characteristics of the beam split surface in a beam splitter or variations in characteristics of the beam split surface due to heat absorption does not occur.

The first optical path deflecting member $M_2$ is more preferably arranged near the intermediate image formed by the first imaging optical system $G_1$. With this arrangement, an influence of a decentering error caused upon deflecting the optical path can be minimized. For example, if an angular error is generated in the optical path deflecting member $M_2$, the second imaging optical system $G_2$ is decentered with respect to the first imaging optical system $G_1$. As a result, an image formed on the second plane P2 is only shifted with respect to the first plane P1, so the imaging performance is hardly influenced.

In the present invention, a field stop is preferably arranged in the optical path from the first imaging optical system $G_1$ to the second imaging optical system $G_2$. At this time, the field stop is preferably integrally formed with the above optical path deflecting member.

In the present invention, the second imaging optical system $G_2$ does not include the concave mirror $M_1$. However, even with a large numerical aperture, a sufficient working distance on the image side can be ensured.

In the present invention, the second imaging optical system $G_2$ preferably has the front optical element group $G_{21}$ having a positive refracting power and the rear optical element group $G_{22}$ having a positive refracting power. In the present invention, an aperture stop can be arranged in the optical path between the front optical element group $G_{21}$ and the rear optical element group $G_{22}$. Therefore, when the aperture stop is constituted by a variable aperture stop, the coherence factor ($\sigma$ value) can be adjusted.

To increase the depth of focus, a special filter can be inserted in the Fourier transform plane in the second imaging optical system $G_2$.

As a method of increasing the depth of focus to increase the resolving power, a phase shift method is proposed in Japanese Patent Laid-Open No. 62-50811 in which the phase of a predetermined portion in the pattern of the reticle R is shifted from the remaining portion. In the present invention, since the coherence factor (σ value) can be adjusted, the effect of the phase shift method can be further increased.

In the present invention, the first imaging optical system $G_1$ preferably has the third optical element group $G_{13}$ arranged in the optical path between the first plane P1 and the first optical element group $G_{11}$. The third optical element group $G_{13}$ has a function of magnifying the first imaging optical system $G_1$. The third optical element group $G_{13}$ is located near the first plane P1 and also has a function of satisfactorily correcting asymmetrical aberrations, and particularly, distortion and chromatic aberration of magnification, which cannot be completely corrected by the first optical element group $G_{11}$, the second optical element group $G_{12}$, and the second imaging optical system $G_2$. The third optical element group $G_{13}$ preferably has the forward lens group $G_{13F}$ having a positive refracting power and the rear lens group $G_{13R}$ having a negative refracting power, in this order from the first plane P1 to the first optical element group $G_{11}$. With this arrangement, satisfactory telecentricity can be maintained while achieving diameter reduction in the overall third optical element group $G_{13}$.

In the present invention, the first and second imaging optical systems $G_1$ and $G_2$ preferably satisfy the following conditions:

$$0.4 < |\beta_1| < 1.2 \tag{1}$$

$$0.2 < |\beta_2| < 0.7 \tag{2}$$

$$1/10 < |\beta_1 \cdot \beta_2| < 1/2 \tag{3}$$

where $\beta_1$ is the imaging magnification of the first imaging optical system, and $\beta_2$ is the imaging magnification of the second imaging optical system.

The above inequalities (1) to (3) define the appropriate magnification ranges of the imaging optical systems $G_1$ and $G_2$ in the present invention to obtain satisfactory imaging performance.

When the imaging magnification of the first imaging optical system $G_1$ is below the lower limit of inequality (1), an intermediate image of a pattern having a predetermined object height on the first plane (object plane) is formed near the optical axis of the first imaging optical system $G_1$. This matter undesirably limits the arrangement of the first optical path deflecting member $M_2$. In addition, a light beam from the first plane P1 to the first imaging optical system $G_1$ may undesirably interfere with the first optical path deflecting member $M_2$.

When the imaging magnification of the first imaging optical system $G_1$ exceeds the upper limit of inequality (1), the diameter of the first imaging optical system $G_1$, and particularly, the lens diameter of the first optical element group $G_{11}$ is undesirably increased to impose a heavy load on the aberration correction by the second imaging optical system $G_2$. Note that the upper limit of inequality (1) is more preferably 1.0.

When the imaging magnification of the second imaging optical system $G_2$ is below the lower limit of inequality (2), aberrations occurring in the second imaging optical system $G_2$ itself undesirably increase. In addition, the diameter of a lens present near a position where an intermediate image is formed is undesirably increased.

When the imaging magnification of the second imaging optical system $G_2$ exceeds the upper limit of inequality (2), the first imaging optical system $G_1$ must have a very large reduction magnification to obtain a desired reduction magnification. At this time, aberrations originating from the first imaging optical system $G_1$ undesirably increase, and the arrangement of the first optical path deflecting member $M_2$ is undesirably limited. Note that the upper limit of inequality (2) is more preferably 0.5.

When the imaging magnification product of the first and second imaging optical systems $G_1$ and $G_2$ is below the lower limit of inequality (3), exposure in a wide range cannot undesirably be achieved with satisfactory optical performance. When the product exceeds the upper limit of inequality (3), it undesirably becomes difficult to increase the numerical aperture on the image side (substrate side).

In the present invention, to further improve the optical performance, the Petzval sum of the overall system is preferably close to zero. From this viewpoint, the catadioptric optical system according to the present invention is preferably arranged to satisfy the following conditions:

$$|P_{G1} + P_{G2}| < 0.1 \tag{4}$$

$$P_{G11} + P_{G21} + P_{G22} > 0 \tag{5}$$

$$P_{G12} < 0 \tag{6}$$

where $P_{G1}$: Petzval value of the first imaging optical system $G_1$, $P_{G2}$: Petzval value of the second imaging optical system $G_2$, $P_{G11}$: Petzval value of the first optical element group $G_{11}$, $P_{G12}$: Petzval value of the second optical element group $G_{12}$, $P_{G21}$: Petzval value of the front optical element group $G_{21}$ in the second imaging optical system $G_2$, $P_{G22}$: Petzval value of the rear optical element group $G_{22}$ in the second imaging-optical system $G_2$.

Similarly, when the third optical element group $G_{13}$ is arranged in the optical path between the first plane P1 and the first optical element group $G_{11}$, the catadioptric optical system according to the present invention is preferably arranged to satisfy inequality (7) in place of inequality (5):

$$P_{G11} + P_{G21} + P_{G22} + P_{G13} > 0 \tag{7}$$

where $P_{G11}$: Petzval value of the first optical element group $G_{11}$, $P_{G12}$: Petzval value of the second optical element group $G_{12}$, $P_{G21}$: Petzval value of the front optical element group $G_{21}$ in the second imaging optical system $G_2$, $P_{G22}$: Petzval value of the rear optical element group $G_{22}$ in the second imaging optical system $G_2$, $P_{G13}$: Petzval value of the third optical element group $G_{13}$ in the first imaging optical system $G_1$.

In this case, the Petzval value of the first imaging optical system $G_1$ includes the sum of the Petzval values of the first optical element group $G_{11}$, the second optical element group $G_{12}$, and the third optical element group $G_{13}$.

The above conditions mean that an increase in Petzval sum, which is caused by a group of elements each having a positive refracting power, is decreased by the second optical element group $G_{12}$ including the concave mirror $M_1$, and correction of Petzval sum is performed by both the first imaging optical system $G_1$ and the second imaging optical system $G_2$. When the above conditions are not satisfied, flatness of the image plane on the second plane P2 is undesirably degraded.

However, when a zone using a portion near a predetermined image height as an exposure area is used, the flatness of the image plane near the predetermined image height need only be considered, so the above conditions need not always be satisfied.

In the present invention, the second imaging optical system $G_2$ preferably consists of at least two optical materials having different dispersion values. With this arrangement, the effect of chromatic aberration correction can be increased.

In the present invention, the front optical element group $G_{21}$ in the second imaging optical system $G_2$ preferably includes a negative lens component consisting of high-dispersion glass, and a positive lens component consisting of low-dispersion glass. The rear optical element group $G_{22}$ in the second imaging optical element system $G_2$ preferably includes a positive lens component consisting of low-dispersion glass.

With this arrangement, the effect of chromatic aberration correction can be further increased.

In the first imaging optical system $G_1$ of the catadioptric optical system according to the present invention, the meniscus lens component in the second optical element group $G_{12}$ preferably has a shape in which the lens surface on the first optical element group $G_{11}$ side is a concave surface facing the first optical element group $G_{11}$, and the lens surface on the concave mirror $M_1$ side is a concave surface facing the first optical element group $G_{11}$. The concave surface (first concave surface) of the meniscus lens component on the first optical element group $G_{11}$ side and the concave surface (second surface) thereof on the concave mirror $M_1$ side are preferably arranged to satisfy inequality (8):

$$0.5 < |r_A|/r_B < 2 \qquad (8)$$

where $r_A$: radius of curvature of the concave surface of the meniscus lens component, on the first optical element group $G_{11}$ side, in the second optical element group $G_{12}$, $r_B$: radius of curvature of the concave surface of the meniscus lens component, on the concave mirror $M_1$ side, in the second optical element group $G_{12}$.

Condition (8) is a condition for obtaining good symmetry of coma. When $|r_A|/r_B$ of the first imaging optical system $G_1$ exceeds the upper limit of condition (8), the upper coma undesirably increases. When $|r_A|/r_B$ of the first imaging optical system $G_1$ is reduced blow the lower limit of condition (8), the lower coma undesirably increases. Note that, in the first imaging optical system $G_1$, a lens component may be present between the first and second concave surfaces.

In the present invention, the following condition is preferably satisfied:

$$1.5 < f_{11}/f_{12} < 3.5 \qquad (9)$$

where $f_{11}$ is the focal length of the first optical element group $G_{11}$, and $f_{12}$ is the focal length of the second optical element group $G_{12}$ in the first imaging optical system $G_1$.

Condition (9) is a condition for further reducing the size of the concave mirror $M_1$ in the second optical element group $G_{12}$. When the upper limit of condition (9) is exceeded, the diameter of a light beam from the first optical element group $G_{11}$ to the concave mirror $M_1$ in the second optical element group $G_{12}$ is undesirably increased to increase the diameter of the concave mirror $M_1$. When $f_{11}/f_{12}$ is below the lower limit of condition (9), the amount of chromatic aberration occurring in the first imaging optical system $G_1$ becomes undesirably large to increase the load of chromatic aberration correction in the second imaging optical system $G_2$.

In the catadioptric optical system according to the present invention, the front optical element group $G_{21}$ and the rear optical element group $G_{22}$ preferably satisfy the following condition:

$$2 < |f_{21}|/f_{22} < 6 \qquad (10)$$

where $f_{21}$: focal length of the front optical element group $G_{21}$, $f_{22}$: focal length of the rear optical element group $G_{22}$.

When the upper limit of condition (10) is exceeded, the imaging magnification of the first imaging optical system $G_1$ must be increased to maintain a predetermined magnification of the overall catadioptric optical system. This undesirably results in an increase in lens diameter of the front optical element group $G_{21}$ in the second imaging optical system $G_2$.

When $|f_{21}|/f_{22}$ is set below the lower limit of condition (10), the imaging magnification of the first imaging optical system $G_1$ must be a very large reduction magnification to maintain a predetermined magnification of the overall catadioptric optical system. This undesirably results in an increase in limitation to the arrangement of the first optical path deflecting member $M_2$.

In the present invention, when the third optical element group $G_{13}$ having the forward lens group $G_{13F}$ of positive refracting power and the rear lens group $G_{13R}$ of negative refracting power is arranged between the first optical element group $G_{11}$ of the first imaging optical system $G_1$ and the first plane P1, the forward lens group $G_{13F}$ and the rear lens group $G_{13R}$ preferably satisfy the following condition:

$$-2 < f_{13F}/f_{13R} < -0.5 \qquad (11)$$

where $f_{13F}$: focal length of the forward lens group $G_{13F}$, $f_{13R}$: focal length of the rear lens group $G_{13R}$.

Condition (11) is a condition associated with maintenance of telecentricity of the third optical element group $G_{13}$ on the first plane P1 side, and distortion correction. When the upper limit of condition (11) is exceeded, and satisfactory imaging performance is to be maintained, the magnification of the overall first imaging optical system $G_1$ is undesirably limited to almost x1. In addition, distortion correction becomes difficult.

When $f_{13F}/f_{13R}$ is set to be smaller than the lower limit of condition (11), distortion is excessively corrected. In addition, a light beam propagating from the third optical element group $G_{13}$ to the first optical element group $G_{11}$ may be undesirably eclipsed by the first optical path deflecting member $M_2$.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 19A to 21E are graphs showing various aberrations in the catadioptric optical system shown in FIG. 17;

FIGS. 24 to 26E are graphs showing various aberrations in the catadioptric optical system shown in FIG. 22;

DETAILED DESCRIPTION OF THE PREFERRED EMBODIMENTS

Embodiments of a catadioptric optical system according to the present invention will be described below with reference to FIGS. 1 to 36. This catadioptric optical system can be applied to both a one-shot exposure apparatus and a scanning exposure apparatus.

Figure 1:
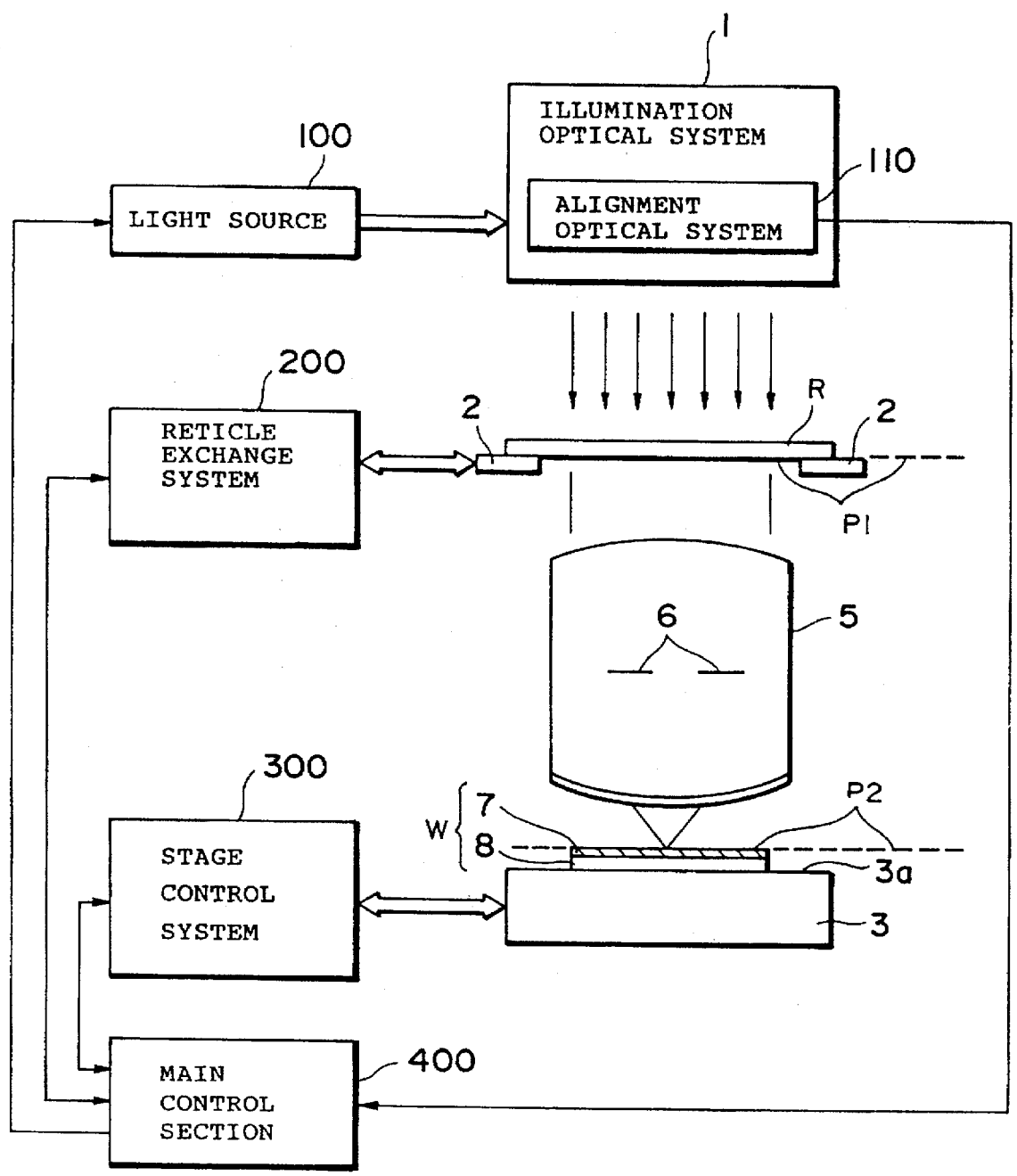
FIG. 1 is a view showing the arrangement of a one-shot exposure apparatus to which a catadioptric optical system according to the present invention can be applied.

FIG. 1 is a view showing the arrangement of an apparatus using a one-shot exposure method. Referring to FIG. 1, the exposure apparatus comprises a movable wafer stage 3 (first stage) capable of holding a photosensitive substrate W on its major surface 3a, a movable reticle stage 2 (second stage) for holding a reticle R, a light source 100 for irradiating an exposure light beam having a predetermined wavelength, and an illumination optical system 1 for irradiating the exposure light beam from the light source 100 onto the reticle R and transferring a predetermined pattern of an electronic circuit or the like on the reticle onto the substrate W. The photosensitive substrate W is formed of a substrate 7 such as a silicon wafer or a glass plate having a surface coated with a photosensitive material 8 such as a photoresist. The illumination optical system 1 has an alignment optical system 110 for aligning the reticle R and the photosensitive substrate W.

The exposure apparatus also has a reticle exchange system 200 for exchanging the reticle R held on the reticle stage 2 or moving the reticle stage 2 in accordance with an instruction from a main control section 400, and a stage control system 300 for moving the wafer stage 3 in accordance with an instruction from the main control section. When alignment of the reticle R and the photosensitive substrate W is to be performed, the main control section 400 obtains the displacement amounts of the stages 2 and 3 from the alignment optical system 110, calculates the moving amounts of the stages 2 and 3, and outputs moving instructions to the stages 2 and 3. The stages 2 and 3 are moved in predetermined directions in accordance with the moving instructions and moving amounts from the main control section 400, thereby adjusting the relative position between the reticle R and the photosensitive substrate W.

A catadioptric optical system 5 according to the present invention is arranged between the reticle stage 2 and the wafer stage 3, i.e., between a first plane P1 (object plane) on the reticle R and a second plane P2 (image plane) on the photosensitive substrate W, to project a reduced image of a predetermined pattern on the reticle R onto the second plane.

Figure 2:
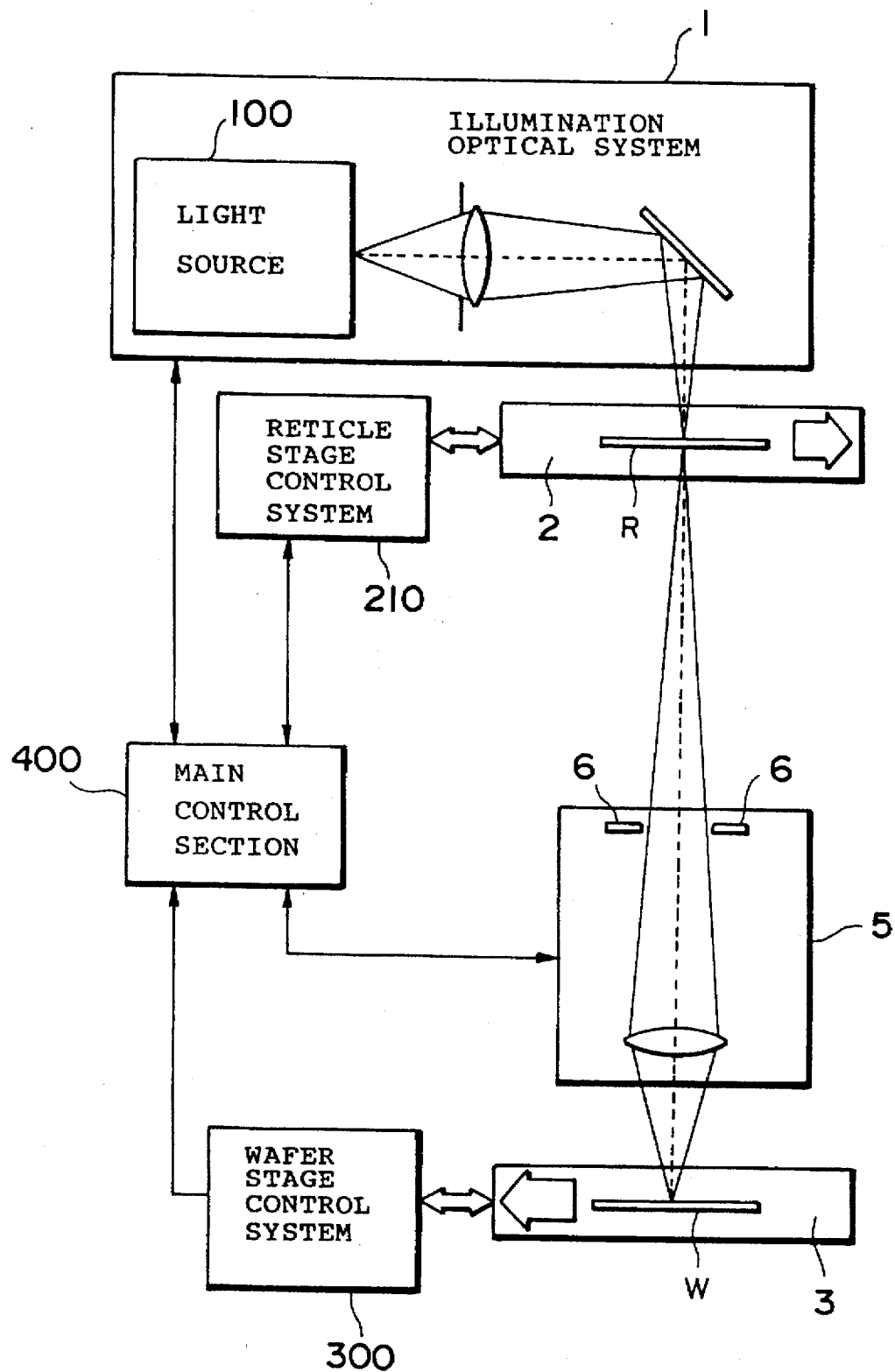
FIG. 2 is a view showing the arrangement of a scanning exposure apparatus to which the catadioptric optical system according to the present invention can be applied.
Figure 4:
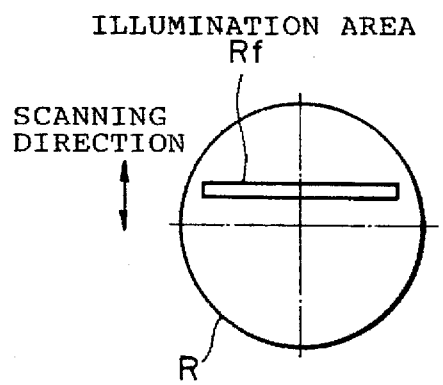
FIG. 4 is a plan view showing a reticle surface viewed from the illumination optical system side.

FIG. 2 is a view showing the arrangement of an apparatus using a scanning exposure method, to which the catadioptric optical system according to the present invention can be applied. As in the one-shot exposure apparatus shown in FIG. 1, this exposure apparatus comprises the movable reticle stage 2, the movable wafer stage 3, the illumination optical system 1 (including the light source 100), and the catadioptric optical system 5 according to the present invention. The illumination optical system 1 irradiates an exposure light beam from the light source 100 onto an illumination area Rf having a predetermined shape on the reticle R (FIG. 4). The catadioptric optical system 5 projects a reduced image of a pattern on the area of the reticle R onto the substrate W (photosensitive substrate). A reticle stage control system 210 can move the reticle stage 2 in a direction in parallel to the second plane P2 of the substrate W. The reticle stage control system 210 is included in the reticle exchange system 200. Similarly, the wafer stage control system 300 can move the wafer stage 3 to change the position of the substrate W held on the stage 3. A computer system serving as the main control section 400 independently controls the reticle stage control system 210 and the wafer stage control system 300. With this arrangement, the exposure apparatus can perform scanning exposure in which the relative position between an exposure area Wf on the substrate W and the illumination area Rf on the reticle R is changed.

Techniques associated with the above exposure apparatuses are disclosed in, e.g., U.S. Ser. Nos. 08/255,927, 08/260,398, and 08/299,305, and U.S. Pat. Nos. 4,497,015, 4,666,273, 5,194,893, 5,253,110, 5,333,035, and 5,379,091. The catadioptric optical system according to the present invention can be applied to all exposure apparatuses disclosed in these prior arts.

U.S. Ser. No. 08/255,927 describes an illumination optical system (using a laser source) applicable to a scanning exposure apparatus. U.S. Ser. No. 08/260,398 describes an illumination optical system (using a lamp source) applicable to a scanning exposure apparatus. U.S. Ser. No. 08/299,305 describes an alignment optical system applicable to a scanning exposure apparatus. U.S. Pat. No. 4,497,015 describes an illumination optical system (using a lamp source) applicable to a general exposure apparatus. U.S. Pat. No. 4,666,273 describes a step-and-repeat exposure apparatus. U.S. Pat. No. 5,194,893 describes a scanning exposure apparatus and, more particularly, an illumination optical system, an illumination area, a mask-side/reticle-side interference system, an automatic focusing mechanism, and an alignment optical system. U.S. Pat. No. 5,253,110 describes an illumination optical system (using a laser source) applied to a step-and-repeat exposure apparatus. The illumination optical system disclosed in this reference can also be applied to a scanning exposure apparatus. U.S. Pat. No. 5,333,035 describes a modified illumination optical system applied to a general exposure apparatus. U.S. Pat. No. 5,379,091 describes an illumination optical system (using a laser source) applied to a scanning exposure apparatus.

Embodiments of the catadioptric optical system according to the present invention will be described below with reference to the accompanying drawings. In each embodiment to be described below, the present invention is applied to a projection optical system in an exposure apparatus for transferring a pattern image formed on the object plane P1 of the reticle R onto a wafer (photosensitive substrate W) coated with a resist, as described above.

Figure 3:
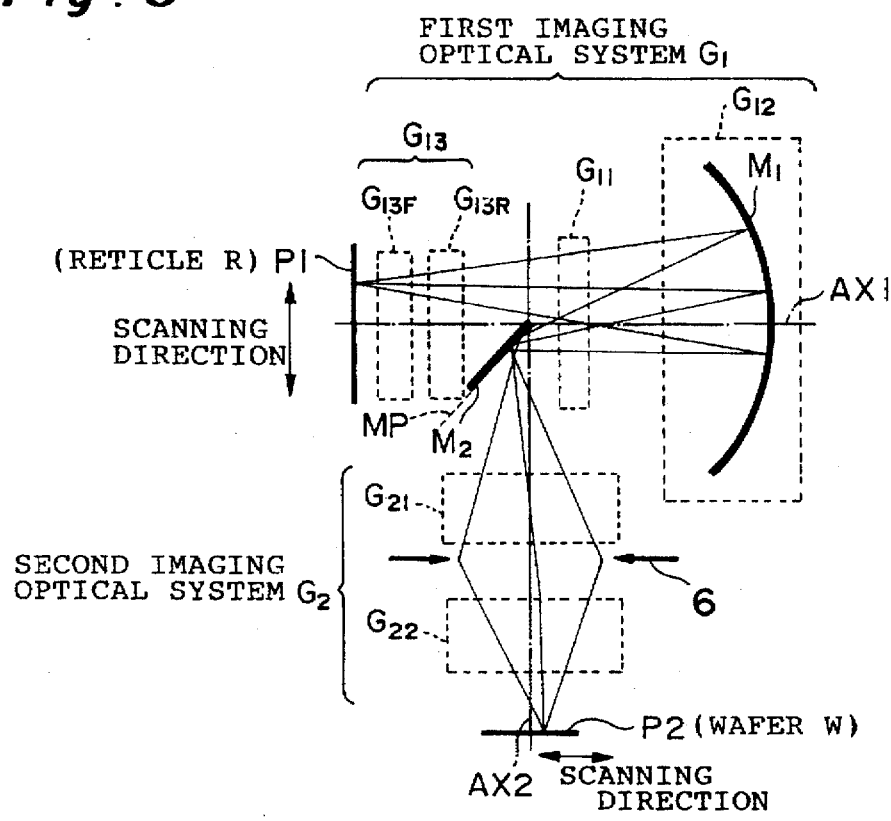
FIG. 3 is a view schematically showing the basic arrangement of the catadioptric optical system according to the present invention.

A schematic arrangement of the catadioptric optical system according to the present invention will be described with reference to FIG. 3. Referring to FIG. 3, a light beam passing through the first plane P1 on the reticle R passes through a third optical element group $G_{13}$ constituted by a forward lens group $G_{13F}$ and a rear lens group $G_{13R}$, passes through a first optical element group $G_{11}$, and reaches a second optical element group $G_{12}$. The second optical element group $G_{12}$ has a concave mirror $M_1$ with a concave surface facing the first optical element group $G_{11}$ side. The light beam from the first optical element group $G_{11}$ reaches the second optical element group $G_{12}$, is reflected by the concave mirror $M_1$, and passes through the first optical element group $G_{11}$ again toward an optical path deflecting mirror $M_2$ serving as a first optical path deflecting member. In this embodiment, the optical path deflecting mirror $M_2$ (the deflecting plane $M_p$ shown in FIG. 3) is inclined by 45° with respect to an optical axis $AX_1$ of the first optical element group $G_{11}$, the second optical element group $G_{12}$, and the third optical element group $G_{13}$. The light beam from the second optical element group $G_{12}$ becomes a converging light beam to form an intermediate image of the reticle R near the optical path deflecting mirror $M_2$. The light beam reflected by the optical path deflecting mirror $M_2$ sequentially passes through a front optical element group $G_{21}$, an aperture stop 6, and a rear optical element group $G_{22}$, and forms a secondary image (image of the intermediate image) of the reticle R on the image plane P2 of the substrate W on the second plane. In FIG. 3, $AX_2$ represents the optical axis of the front optical element group $G_{21}$ and the rear optical element group $G_{22}$.

In the following embodiments, the optical system for forming an intermediate image of the reticle R is called a first imaging optical system $G_1$, and the optical system for refocusing the intermediate image is called a second imaging optical system $G_2$. In the example shown in FIG. 3, the first optical element group $G_{11}$, the second optical element group $G_{12}$, and the third optical element group $G_{13}$ constitute the first imaging optical system $G_1$, and the front optical element group $G_{21}$ and the rear optical element group $G_{22}$ constitute the second imaging optical system $G_2$. Note that the third optical element group $G_{13}$ is not essential, as will be described later in the fourth embodiment.

Figure 5:
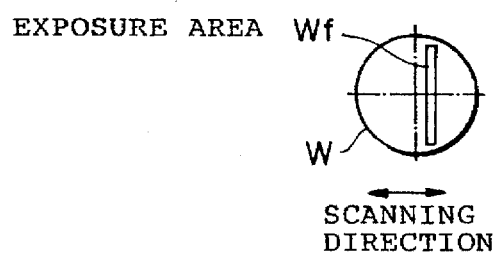
FIG. 5 is a plan view showing a substrate surface viewed from the second imaging optical system side.

In a scanning exposure apparatus, as shown in FIG. 4, the illumination optical system 1 irradiates an exposure light beam on the illumination area Rf on the reticle R. With this operation, the exposure area Wf as shown in FIG. 5 is formed on the substrate W. The reticle stage control system 210 moves the stage 2 in a direction indicated by an arrow in FIG. 4 in accordance with an instruction from the main control section 400, thereby moving the reticle R. The wafer stage control system 300 moves the stage 3 in a direction indicated by an arrow in FIG. 5 in accordance with an instruction from the main control section 400, thereby moving the substrate W.

Figure 6:
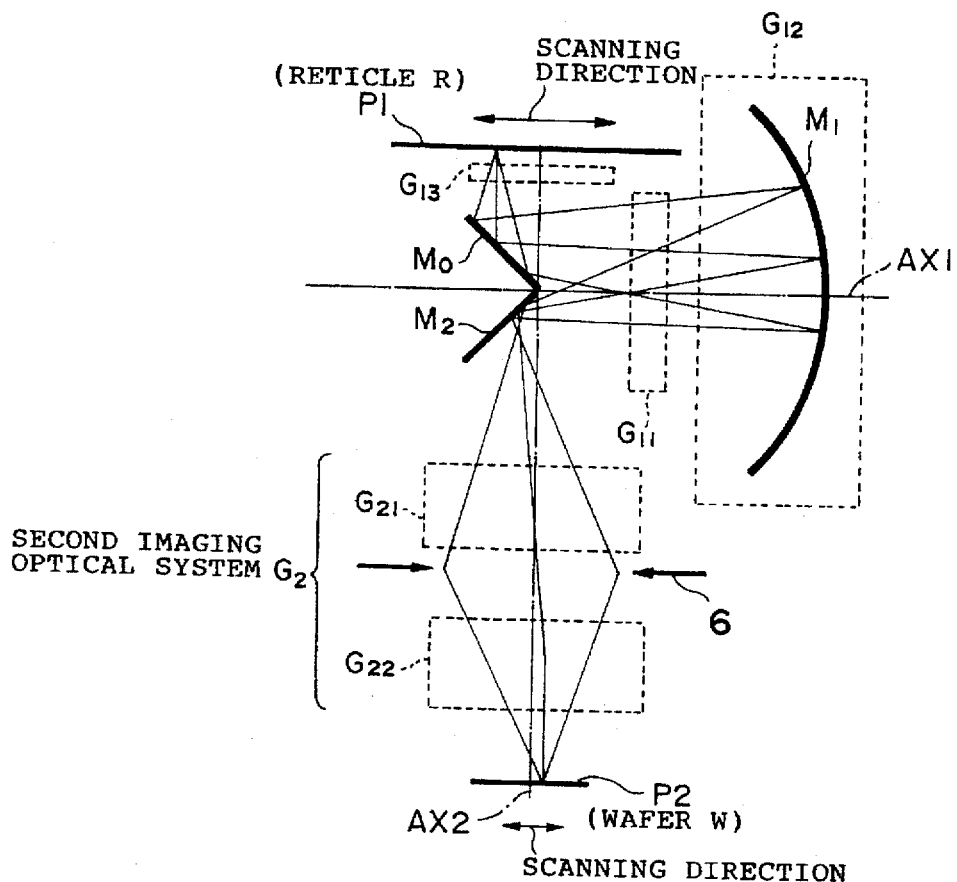
FIG. 6 is a view schematically showing the arrangement of the first application of the catadioptric optical system according to the present invention.

FIG. 6 is a view showing another arrangement (first application of the arrangement shown in FIG. 3) of the catadioptric optical system according to the present invention. The same reference numerals as in FIG. 3 denote the same members in FIG. 6.

FIG. 6 is different from FIG. 3 in that an optical path deflecting mirror $M_0$ serving as a second optical path deflecting member is arranged in the optical path between the third optical element group $G_{13}$ and the first optical element group $G_{11}$. The optical path deflecting mirror $M_0$ is inclined by 45° with respect to the optical axis $AX_1$ of the first optical element group $G_{11}$ and the second optical element group $G_{12}$. The normal to the mirror $M_0$ is perpendicular to that to the optical path deflecting mirror $M_2$. With this arrangement, the propagation direction of a light beam through the first imaging optical system $G_1$ and the optical path deflecting mirror $M_2$ coincides with that of a light beam from the first plane P1. For this reason, the first plane P1 and the second plane P2 can be arranged parallel to each other. Therefore, a mechanism for holding and scanning the first plane P1 and the second plane P2 can be easily formed.

In the application shown in FIG. 6, the optical path deflecting mirrors $M_0$ and $M_2$ may be integrally formed. In this case, the reflecting surfaces of the optical path deflecting mirrors $M_0$ and $M_2$, which are perpendicular to each other, can be easily fabricated to facilitate maintenance of the angle therebetween. In addition, when the optical path deflecting mirrors $M_0$ and $M_2$ are integrally formed, size reductions of these mirrors $M_0$ and $M_2$ can be achieved to increase the degree of freedom in lens arrangement.

The arrangement of the catadioptric optical system shown in FIG. 6 is effective at the time of performing a projection exposure method using a large-sized photomask or glass plate. In this case, the optical system in FIG. 6 is preferably set so that the first surface P1 and the second surface P2 are vertically arranged. Because, with this arrangement, the mask or plate can prevent it's flection with respect to gravity. Therefore, since the concave mirror $M_1$ becomes to be horizontally arranged, the horizontal arrangement of the concave mirror $M_1$ is remarkably effective for optical performance.

Figure 7:
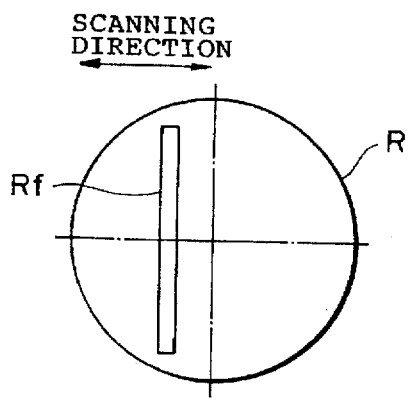
FIG. 7 is a plan view showing the reticle surface viewed from the illumination optical system side.
Figure 8:
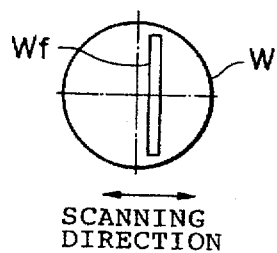
FIG. 8 is a plan view showing the substrate surface viewed from the second imaging optical system side.

FIG. 7 is a plan view showing the illumination area Rf on the reticle R and the moving direction of the reticle R (indicated by an arrow in FIG. 7). FIG. 8 is a plan view showing the exposure area Wf on the substrate W and the moving direction of the substrate W (indicated by an arrow in FIG. 8).

Figure 9:
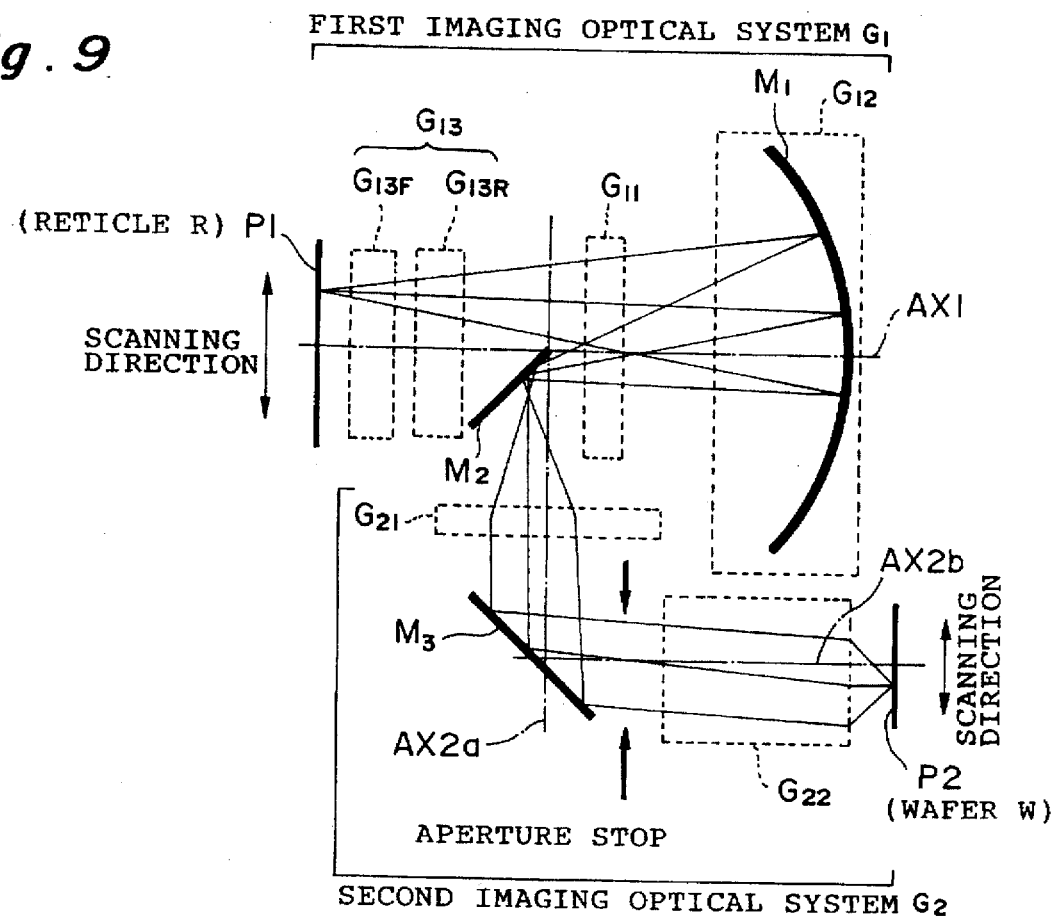
FIG. 9 is a view showing the arrangement of the second application of the catadioptric optical system according to the present invention.
Figure 10:
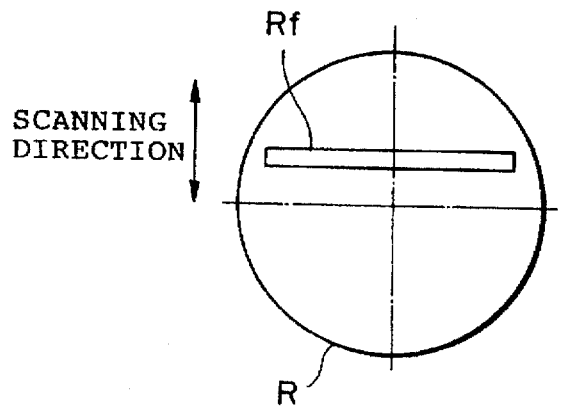
FIG. 10 is a plan view showing the reticle surface viewed from the illumination optical system side.
Figure 11:
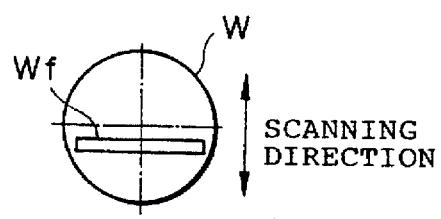
FIG. 11 is a plan view showing the substrate surface viewed from the second imaging optical system side.

FIG. 9 is a view showing still another arrangement (second application of the arrangement shown in FIG. 3) of the catadioptric optical system according to the present invention. The same reference numerals as in FIG. 3 denote the same members in FIG. 9. FIG. 10 is a plan view showing the illumination area Rf on the reticle R and the moving direction of the reticle R (indicated by an arrow in FIG. 10). FIG. 11 is a plan view showing the exposure area Wf on the substrate W and the moving direction of the substrate W (indicated by an arrow in FIG. 11).

FIG. 9 is different from FIG. 3 in that an optical path deflecting mirror $M_3$ serving as a third optical path deflecting member inclined by 45° with respect to an optical axis $AX_{2a}$ of the front optical element group $G_{21}$ (optical axis $AX_{2b}$ of the rear optical element group $G_{22}$) is arranged between the front optical element group $G_{21}$ and the rear optical element group $G_{22}$ in the second imaging optical system $G_2$, together with the aperture stop 6. With this arrangement, the propagation direction of a light beam emerging from the rear optical element group $G_{22}$ and reaching the second plane P2 coincides with that of a light beam incident from the first plane P1 on the first imaging optical system $G_1$. For this reason, the first plane P1 and the second plane P2 can be arranged in parallel to each other. Therefore, a mechanism for holding and scanning the first plane P1 and the second plane P2 can be easily formed.

In the example shown in FIG. 9, the optical path deflecting mirrors $M_2$ and $M_3$ are arranged such that the propagation direction of a light beam from the first optical element group $G_{11}$ to the optical path deflecting mirror $M_2$ in the first imaging optical system $G_1$ is opposite to that of a light beam from the optical path deflecting mirror $M_3$ to the rear optical element group $G_{22}$ in the second imaging optical system $G_2$. For this reason, the catadioptric optical system itself can be made compact. Particularly, according to this arrangement, the interval between the first plane P1 and the second plane P2 can be decreased to make the overall exposure apparatus compact. In the application shown in FIG. 9, since the optical path deflecting mirror $M_2$ can be arranged near an intermediate image formed by the first imaging optical system, a size reduction of the optical path deflecting mirror $M_2$ can be realized to increase the degree of freedom in arrangement of the optical system.

In the applications shown in FIGS. 6 and 9, when the optical system is arranged such that the first plane P1 and the second plane P2 are horizontally arranged, the number of optical elements that are susceptible to asymmetric deformation by gravity is minimized. For this reason, the first and second planes P1 and P2 are preferably horizontally arranged, and at the same time, the first plane P1 is preferably arranged above the second plane P2 (at the upper portion of the apparatus). Particularly, in the application shown in FIG. 9, elements except for the front optical element group $G_{21}$ in the second imaging optical system $G_2$ do not asymmetrically deform. Therefore, this arrangement is very advantageous for optical performance. The horizontal arrangement of the concave mirror $M_1$ is particularly effective. Note that, in this specification, the horizontal direction means a direction perpendicular to the direction of gravity. Therefore, a horizontally arranged member means a member placed on a plane perpendicular to the direction of gravity. On the other hand, the vertical direction means a direction perpendicular to the horizontal direction, and further a vertically arranged member means a member placed on a plane perpendicular to the horizontal direction.

In each of the above arrangements, the aperture stop 6 can be arranged in the second imaging optical system $G_2$. At this time, the aperture stop 6 is constituted by a sigma (σ) variable stop. A sigma (σ) variable stop can change the sigma (σ) value as a ratio of the numerical aperture NA of the illumination optical system 1 to that of the projection optical system 5. When the aperture stop 6 is arranged in the second imaging optical system $G_2$, the numerical aperture NA of the projection optical system 5 can be changed. Particularly, in the catadioptric optical system according to the present invention, the aperture stop 6 is preferably arranged in the second imaging optical system $G_2$ which hardly suffers a mechanical interference.

Instead of arranging the aperture stop 6 (σ variable stop), variable special filters can also be arranged to increase the depth of focus. A special filter will be described below with reference to FIGS. 32 to 34.

Figure 32:
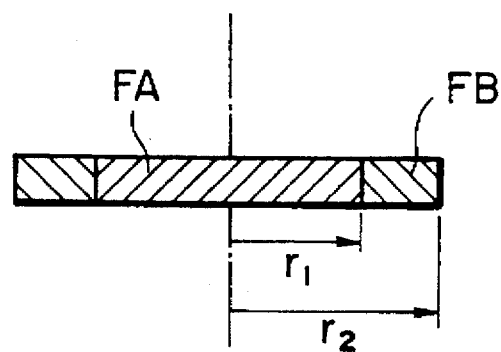
FIGS. 32 to 34 are views showing a special filter applied to the catadioptric optical system according to the present invention.
Figure 33:
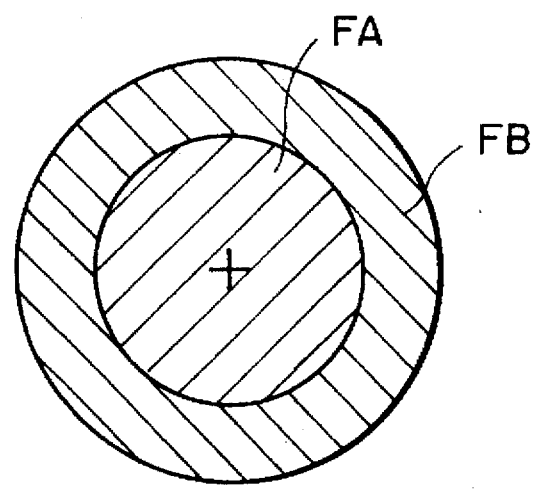

In the following numerical examples, the optical system is telecentric on the object side (reticle side) and on the image side (substrate side), and principal rays from the respective points on the object side cross at one point on the optical axis. In this situation, a plane including the point where principal rays cross the optical axis is called a Fourier transform plane. The specific filter is arranged on this Fourier transform plane. On the Fourier transform plane, the order of diffraction light is determined by the distance from the optical axis. As the distance from the optical axis increases, the order increases accordingly. A general projection exposure optical system uses 0th- and 1st-order diffracted light. Therefore, as shown in FIGS. 32 and 33, the area of a filer is divided into two portions, i.e., an area FA near the optical axis with a radius $r_1$, where a 0th-order light component is present, and an area FB near the aperture portion from the radius $r_1$ to a radius $r_2$, where 1st-order light (and diffraction light of higher orders) is present.

Figure 34:
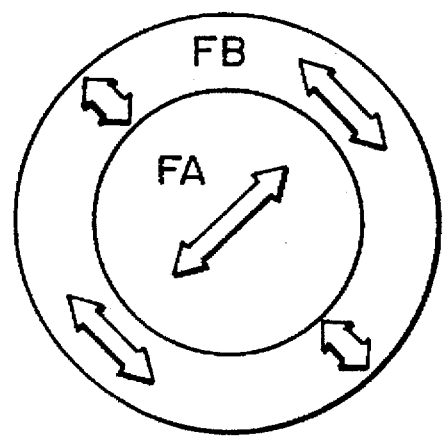

As shown in FIG. 34, the concentrically divided filter forms a polarizing film for transmitting only s-polarized light through the central area FA and transmitting only p-polarized light through the peripheral area FB. As a matter of course, the central area FA may transmit only p-polarized light, and the peripheral area FB may transmit only s-polarized light. At this time, the refractive index of the central area FA is set lower than that of the peripheral area FB.

With the above arrangement, a light beam transmitted through the peripheral area FB of the special filter is normally formed into an image on a focal plane. On the other hand, a light beam transmitted through the central area FA of the special filter is focused at a position apart from the lens, which is at a greater distance than a normal focal plane. The light beam transmitted through the peripheral area FB and that transmitted through the central area FA are in different polarized states, so these light beams do not interfere with each other. Therefore, the depth of focus can be increased. Techniques of increasing the depth of focus are disclosed in, e.g., Japanese Patent Laid-Open Nos. 61-91662, 5-234850, 6-120110, 6-124870, 7-57992, and 7-57993, all of which can be applied to the present invention. Particularly, these techniques can be effectively used to form an isolated pattern.

Figure 35:
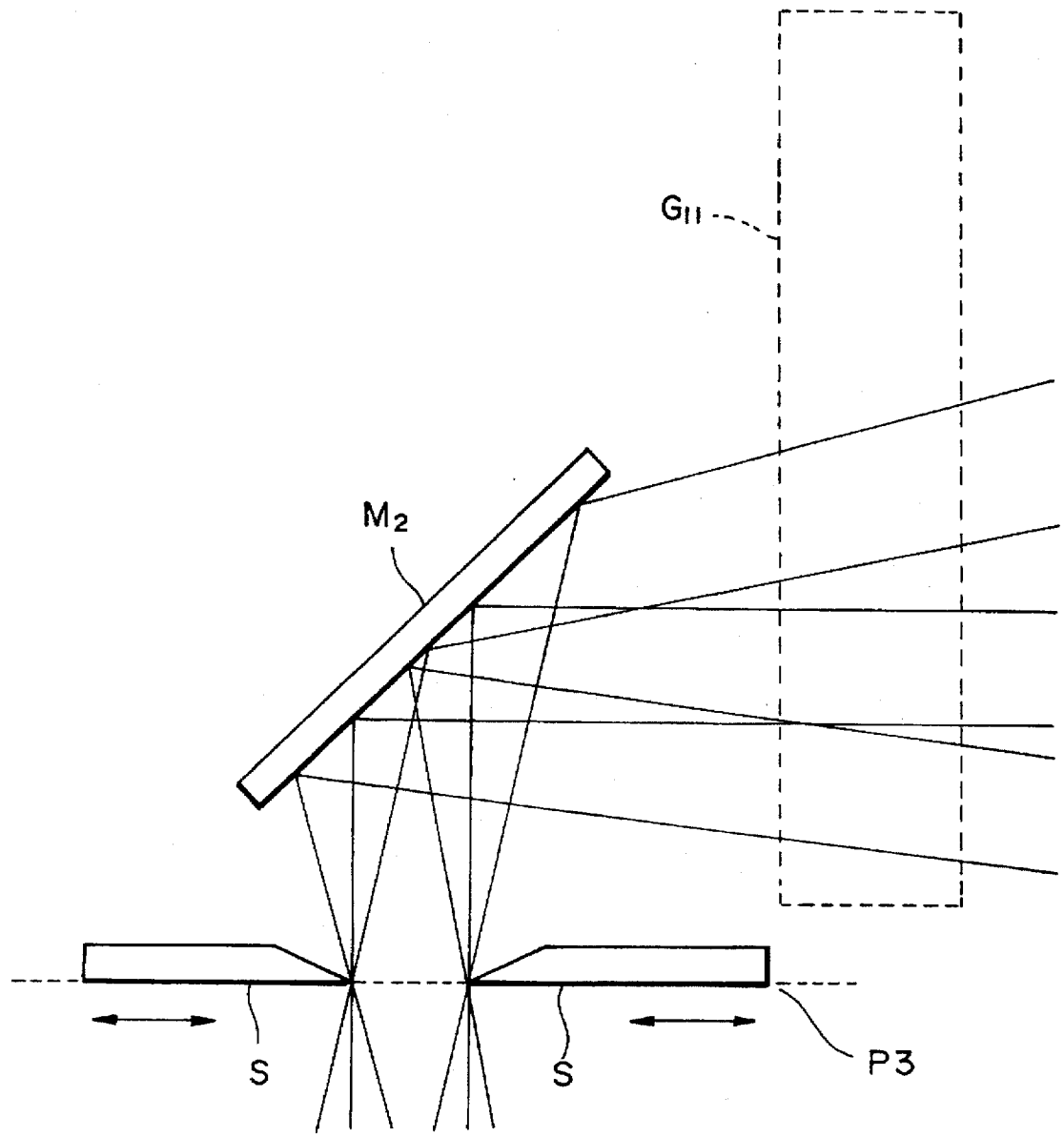
FIG. 35 is a view showing part of the arrangement of a catadioptric optical system having a field stop.

When a stop is arranged on a plane where an intermediate image is formed, this stop can be constituted by a field stop. In the embodiments of this specification, a field stop can be arranged between the first imaging optical system $G_1$ and the second imaging optical system $G_2$. In the above embodiment, as shown in FIGS. 3, 6, and 9, an intermediate image is formed near the mirror. Therefore, the stop can be arranged near the mirror. An arrangement with a stop is shown in FIG. 35.

When a field stop is arranged, the optical path deflecting mirror $M_2$ is arranged as close as possible to the first optical element group $G_{11}$ in the first imaging optical system $G_1$, as shown in FIG. 3. In this case, a plane P3 where an intermediate image is formed moves close to the front optical element group $G_{21}$ in the second imaging optical system $G_2$ from a portion near the optical path deflecting mirror $M_2$. With this arrangement, the optical path deflecting mirror $M_2$, the first optical element group $G_{11}$ in the first imaging optical system $G_1$, and the field stop function hardly mechanically interfere with each other. A field stop S formed of a light-shielding member is arranged on the plane P3 where an intermediate image is formed. When the field stop S moves, the range for forming an intermediate image changes. Therefore, the range for finally forming an image on the second plane P2 changes accordingly.

Techniques of changing the field size are disclosed in, e.g., Japanese Patent Laid-Open Nos. 57-192024, 60-30132, 60-45252, Japanese Utility Model Laid-Open No. 62-124845, and U.S. Pat. Nos. 4,473,293 and 4,474,463, all of which can be applied to the embodiments described in this specification.

As described above, a field stop is realized by moving a movable light-shielding member as needed. Instead, mirrors with different sizes can be exchanged and used in place of a field stop.

The shape of the field stop with a variable aperture shown in FIG. 35 is not limited to a rectangle, and it can also be applied to an arc or a polygon other than a rectangle, as a matter of course.

Figure 12:
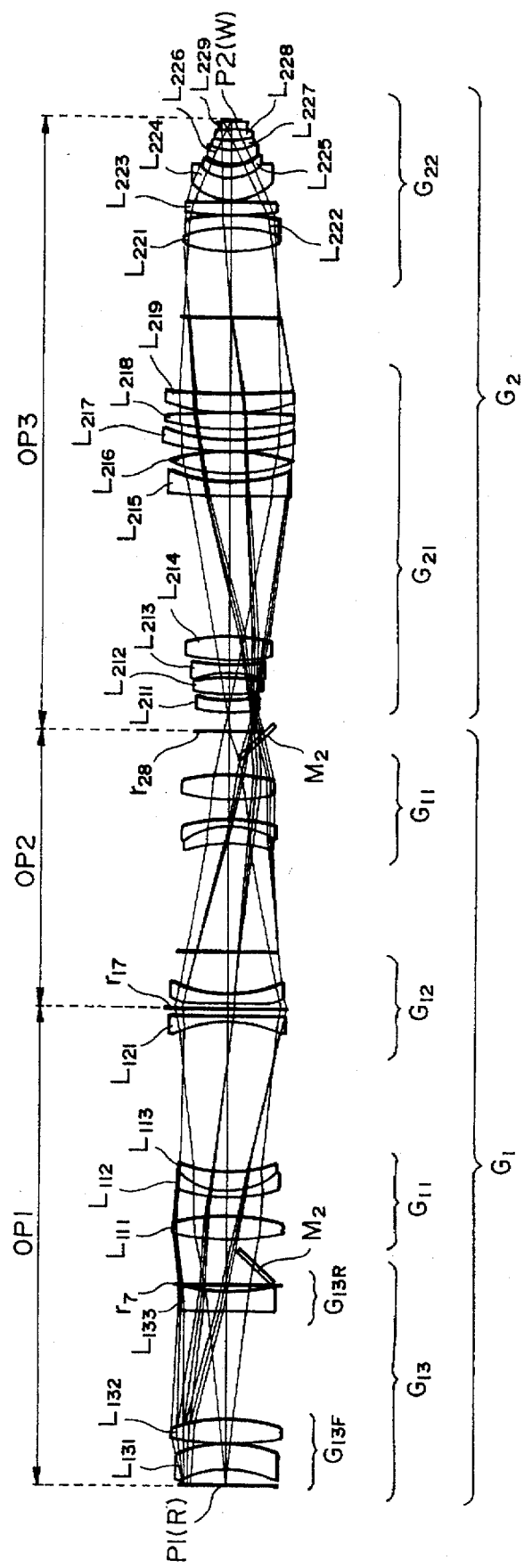
FIG. 12 is a view of a developed optical path formed by the first lens arrangement in the catadioptric optical system according to the present invention.

The numerical examples of the catadioptric optical system of the present invention will be described below. In the following numerical examples, the lens arrangement is represented by an optical path development, as shown in FIG. 12. In the optical path development, a reflecting surface is represented as a transparent surface, and optical elements are arranged in the order in which a light beam from the reticle R (first plane P1) passes through. On a reflecting surface (e.g., $r_{18}$) of a concave reflecting mirror, a virtual plane (e.g., $r_{17}$) is used. To represent the shapes of lenses and intervals therebetween, the pattern surface (image plane P1) of the reticle R is defined as the 0th surface, and each surface through which a light beam from the reticle R passes until reaching the substrate W is defined as the ith surface (i=1, 2, ... ). The sign of a radius $r_i$ of curvature of the ith surface is positive when a convex surface faces the reticle R in the developed optical path diagram. The surface-to-surface distance between the ith surface and the (i+1)th surface is defined as $d_i$. The reference $d_0$ denotes a distance between the first plane P1 and the 1-th surface. $SiO_2$ and $CaF_2$ respectively represent synthetic silica and fluorite as glass materials. The refractive indices of synthetic silica and fluorite at the fundamental wavelength (193.0 nm) are as follows:

Synthetic silica: 1.56019

Fluorite: 1.50138

Dispersion values 1/v are as follows:

Synthetic silica: 1780

Fluorite: 2550

The dispersion values in the embodiments are dispersion values of ±0.1 nm with respect to the fundamental wavelength (193.0 nm).

First Numerical Example

Figure 13:
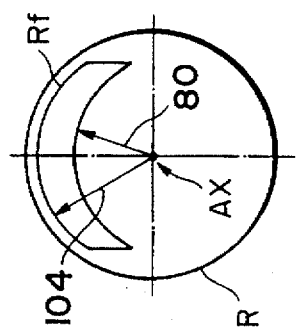
FIG. 13 is a view showing the reticle surface viewed from the illumination optical system side.

The first numerical example according to the present invention, for example the arrangement shown in FIG. 3, will be described with reference to FIGS. 12 and 13. FIG. 12 is an optical path development showing the first lens arrangement of the catadioptric optical system according to the present invention. FIG. 13 is a plan view showing a field on the reticle R of the catadioptric optical system in FIG. 12.

The lens arrangement (first lens arrangement) of the lens groups shown in FIG. 12 will be described. The forward lens group $G_{13F}$ comprises a meniscus negative lens component $L_{131}$ with a concave surface facing the object side, and a biconvex positive lens component $L_{132}$, in this order from the reticle R side. The rear lens group $G_{13R}$ arranged subsequent to the forward lens group $G_{13F}$ comprises a biconcave negative lens component $L_{133}$ with a strong concave surface facing the first optical element group $G_{11}$ side. The first optical element group $G_{11}$ comprises a biconvex lens component $L_{111}$, a meniscus negative lens component $L_{112}$ with a convex surface facing the reticle R side, and a meniscus positive lens component $L_{113}$ with a convex surface facing the reticle R side, in this order from the reticle R side. The second optical element group $G_{12}$ comprises a meniscus negative lens component $L_{121}$ with a concave surface facing the reticle R side, and a concave mirror $M_1$ with a concave surface facing the reticle R side, in this order from the reticle R side.

A light beam from the reticle R sequentially passes through the forward lens group $G_{13F}$, the rear lens group $G_{13R}$, and the first optical element group $G_{11}$, and reaches the second optical element group $G_{12}$. The light beam from the second optical element group $G_{12}$ passes through the first optical element group $G_{11}$ again to form an intermediate image of the reticle R between the rear lens group $G_{13R}$ and the first optical element group $G_{11}$.

The front optical element group $G_{21}$ comprises, in the following order from the intermediate image side, a meniscus negative lens component $L_{211}$ with a convex surface facing the intermediate image side, a biconvex positive lens component $L_{212}$, a biconcave negative lens component $L_{213}$ with a strong concave surface facing the intermediate image side, a biconvex positive lens component $L_{214}$, a meniscus negative lens component $L_{215}$ with a convex surface facing the intermediate image side, a biconvex positive lens component $L_{216}$, a meniscus negative lens component $L_{217}$ with a convex surface facing the intermediate image side, a biconvex positive lens component $L_{218}$, and a meniscus positive lens component $L_{219}$ with a convex surface facing the intermediate image side.

The rear optical element group $G_{22}$ arranged subsequent to the front optical element group $G_{21}$ comprises, in the following order from the intermediate image side, a biconvex positive lens component $L_{221}$, a meniscus negative lens component $L_{222}$ with a concave surface facing the intermediate image side, an almost plano-convex positive lens component $L_{223}$, a meniscus negative lens component $L_{224}$ with a convex surface facing the intermediate image side, a meniscus negative lens component $L_{225}$ with a convex surface facing the intermediate image side, a meniscus positive lens component $L_{226}$ with a convex surface facing the intermediate image side, a meniscus positive lens component $L_{227}$ with a convex surface facing the intermediate image side, a meniscus positive lens component $L_{228}$ with a convex surface facing the intermediate image side, and a meniscus positive lens component $L_{229}$ with a convex surface facing the intermediate image side. In FIG. 12, OP1 represents an optical path from the first plane P1 to the reflecting surface of the concave mirror $M_1$; OP2, an optical path from the reflecting surface of the concave mirror $M_1$ to the reflecting surface of the mirror $M_2$; and OP3, an optical path from the reflecting surface of the mirror $M_2$ to the second plane.

The numerical data of the first numerical example is shown in Table 1. In this example, the magnification of the overall system is x¼ (reduction), and the numerical aperture NA on the substrate W side is 0.6. As shown in FIG. 13, the catadioptric optical system of this embodiment has a zone field at an object height of 80 to 104 from the optical axis AX on the reticle R. The unit of the object height coincides with the unit of the distance d or $d_0$.

In the example shown in Table 1, the optical path deflecting mirror $M_2$ is positioned at the 7th and 28th surfaces. In Table 1, the concave mirror $M_1$ corresponds to the 18th surface, and its virtual plane corresponds to the 17th surface.

TABLE 1 d0 = 36.439

|  | r | d | Glass Material (n) |
|---|---|---|---|
| 1 | −235.081 | 57.193 | SiO2 |
| 2 | −296.984 | 0.114 |  |
| 3 | 980.895 | 57.193 | SiO2 |
| 4 | −404.213 | 256.367 |  |
| 5 | −44202.409 | 46.898 | SiO2 |
| 6 | 304.521 | 11.439 |  |
| 7 | 0.000 | 108.321 |  |
| 8 | 565.855 | 57.193 | CaF2 |
| 9 | −441.237 | 46.855 |  |
| 10 | 403.722 | 14.231 | SiO2 |
| 11 | 168.569 | 0.355 |  |
| 12 | 169.260 | 41.945 | CaF2 |
| 13 | 297.659 | 256.120 |  |
| 14 | 0.000 | 104.439 |  |
| 15 | −288.956 | 17.618 | SiO2 |
| 16 | −1362.463 | 11.696 |  |
| 17 | 0.000 | 0.000 | Virtual plane |
| 18 | 379.633 | 11.696 |  |
| 19 | 1362.463 | 17.618 | SiO2 |
| 20 | 288.956 | 104.439 |  |
| 21 | 0.000 | 256.120 |  |
| 22 | −297.659 | 41.945 | CaF2 |
| 23 | −169.260 | 0.355 |  |
| 24 | −168.569 | 14.231 | SiO2 |
| 25 | −403.722 | 46.855 |  |
| 26 | 441.237 | 57.193 | CaF2 |
| 27 | −565.855 | 108.321 |  |
| 28 | 0.000 | 47.180 |  |
| 29 | 390.727 | 29.649 | SiO2 |
| 30 | 216.684 | 14.478 |  |
| 31 | 483.472 | 40.264 | CaF2 |
| 32 | −373.018 | 14.083 |  |
| 33 | −212.500 | 18.668 | SiO2 |
| 34 | 752.410 | 11.954 |  |
| 35 | 447.892 | 57.193 | CaF2 |
| 36 | −305.822 | 333.558 |  |
| 37 | 2215.659 | 29.691 | SiO2 |
| 38 | 355.135 | 21.084 |  |
| 39 | 397.251 | 47.749 | CaF2 |
| 40 | −917.284 | 0.060 |  |
| 41 | 585.100 | 29.886 | SiO2 |
| 42 | 416.841 | 29.423 |  |
| 43 | 700.440 | 33.483 | CaF2 |
| 44 | −3715.651 | 0.060 |  |
| 45 | 436.109 | 43.924 | CaF2 |
| 46 | 1705.824 | 177.385 |  |
| 47 | 0.000 | 154.230 |  |

TABLE 1-continued d0 = 36.439

|  | r | d | Glass Material (n) |
|---|---|---|---|
| 48 | 355.478 | 49.014 | SiO2 |
| 49 | −563.952 | 4.328 |  |
| 50 | −395.497 | 25.883 | SiO2 |
| 51 | −682.185 | 0.392 |  |
| 52 | 587.031 | 34.883 | SiO2 |
| 53 | 20495.280 | 0.281 |  |
| 54 | 119.424 | 53.761 | CaF2 |
| 55 | 94.335 | 4.064 |  |
| 56 | 104.283 | 20.589 | SiO2 |
| 57 | 88.144 | 9.801 |  |
| 58 | 86.532 | 33.024 | CaF2 |
| 59 | 102.692 | 1.790 |  |
| 60 | 146.044 | 17.140 | SiO2 |
| 61 | 173.630 | 1.467 |  |
| 62 | 152.784 | 23.238 | SiO2 |
| 63 | 416.705 | 1.721 |  |
| 64 | 378.175 | 16.255 | SiO2 |
| 65 | 3716.296 | 9.676 |  |

Figure 14A:
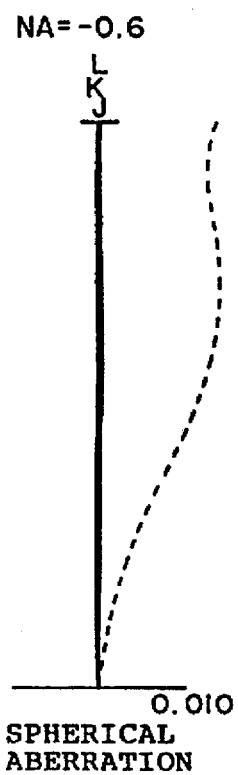
FIGS. 14A to 16E are graphs showing various aberrations in the catadioptric optical system shown in FIG. 12.
Figure 14B:
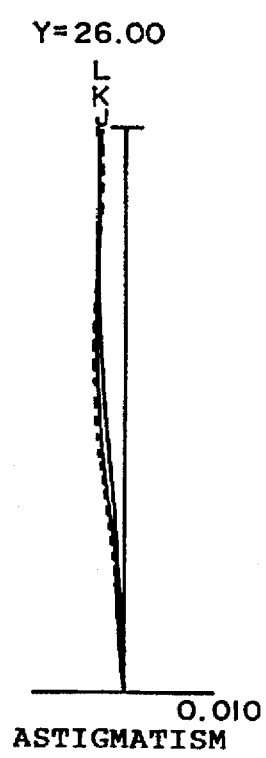
Figure 14C:
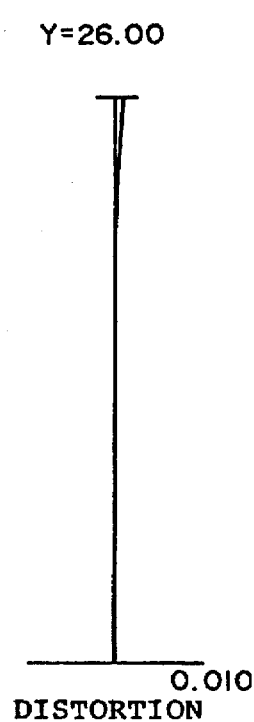
Figure 15:
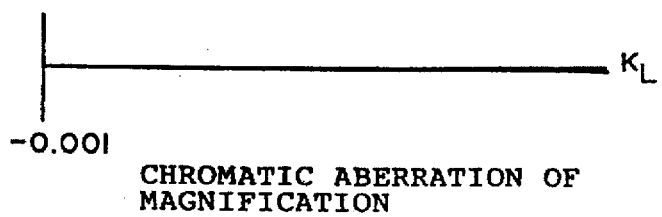
Figure 16A:
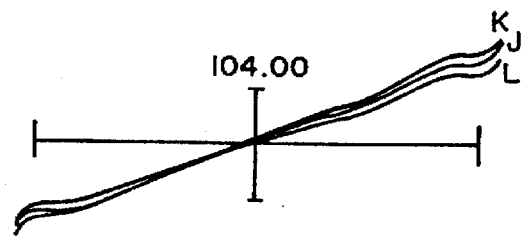
Figure 16B:
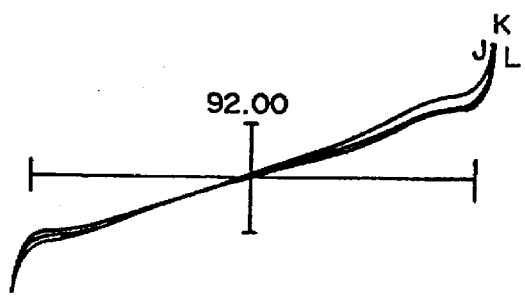
Figure 16C:
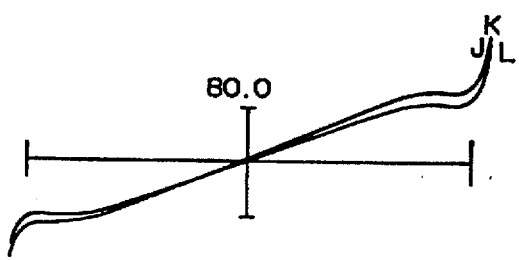
Figure 16D:
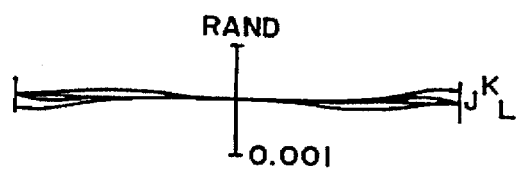
Figure 16E:
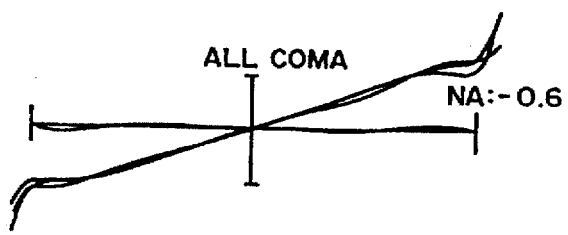

The condition correspondence values are as follows:

(1) $|\beta 1|=0.69219$
(2) $|\beta 2|=0.36298$
(3) $|\beta 1.\beta 2|=0.25$
(4) $|PG1+PG2|=0.00002$
(6) $PG12=-0.00625$
(7) $PG11+PG21+PG22+PG13=6.29\times 10^{-3}$
(8) $|rA|/rB=0.969$
(9) $f11/f12=2.46$
(10) $|f21|/f22=2.69$
(11) $f13F/f13R=-1.041$ FIGS. 14A–14C are graphs showing the longitudinal aberration of the first numerical example having the first lens arrangement shown in FIG. 12. FIG. 15 is a graph showing the chromatic aberration of magnification of the first numerical example. FIGS. 16A–16E are graphs showing the transverse aberration of the first numerical example. In these graphs, NA represents the numerical aperture, and Y represents the image height. Symbols J, K, and L represent wavelengths of 193.0 nm, 192.9 nm, and 193.1 nm, respectively. In the graph showing spherical aberration shown in FIGS. 14A–14C, a dashed line indicates the sine condition transgression amount. In the graph showing astigmatism, a dashed line indicates the meridional image surface, and a solid line indicates the sagittal image surface. In the graph showing transverse aberration shown in FIGS. 16A–16E, a number above each coma represents the object height.

As is apparent from the various aberrations shown in FIGS. 14A to 16E, in this numerical example, the aberrations are satisfactorily corrected in a wide range in spite of a large numerical aperture NA, 0.6. In addition, as is apparent from the various aberrations shown in FIGS. 14A to 16E, in this numerical example, the on-axis and chromatic aberration of magnifications are also satisfactorily corrected in a wavelength width range of 0.1 nm. The aberration curves in the transverse aberration shown in FIGS. 16A–16E have certain slopes. This means that optimum performance is obtained at a defocused portion.

Second Numerical Example

Figure 17:
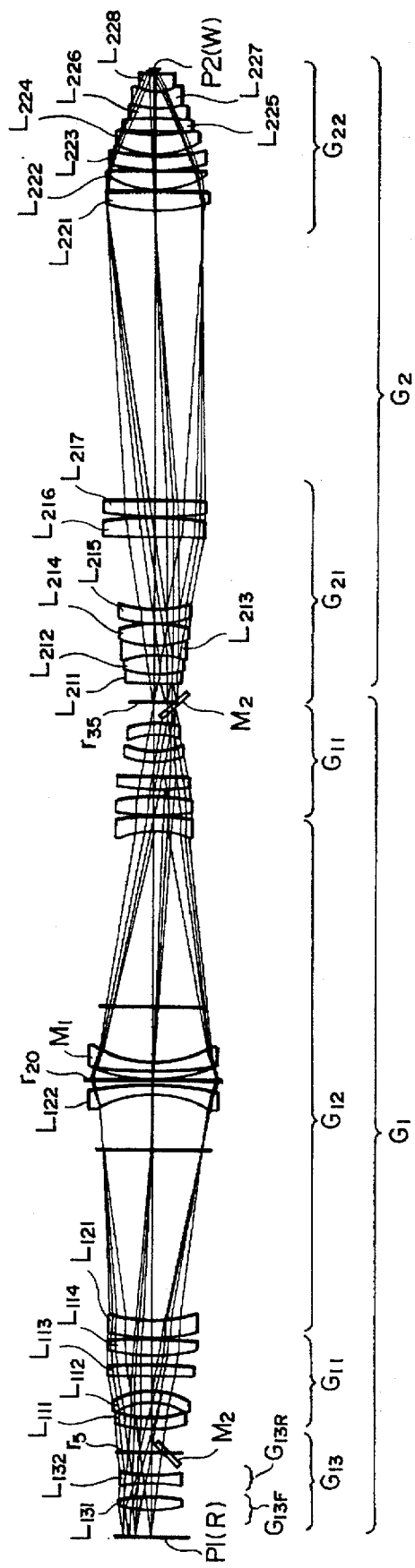
FIG. 17 is a view of a developed optical path formed by the second lens arrangement in the catadioptric optical system according to the present invention.
Figure 18:
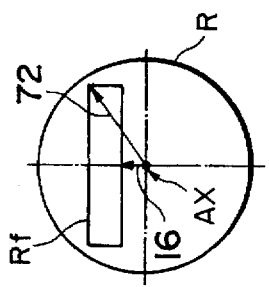
FIG. 18 is a view showing the reticle surface viewed from the illumination optical system side.
Figure 21A:
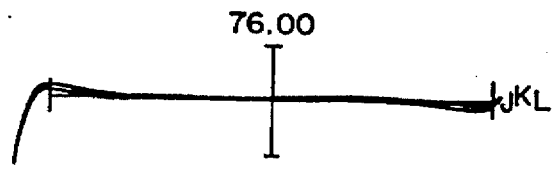
Figure 21B:
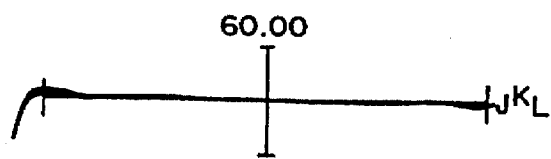
Figure 21C:
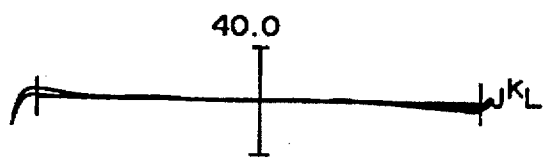
Figure 21D:
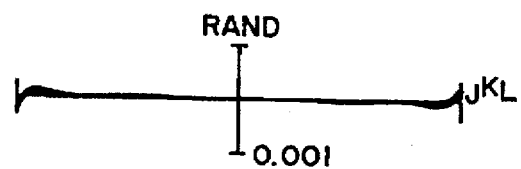
Figure 21E:
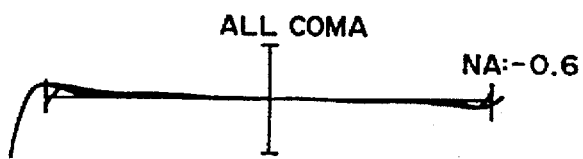

The second numerical example according to the present invention, for example the arrangement shown in FIG. 3, will be described with reference to FIGS. 17 and 18. FIG. 17 is an optical path development showing the second lens arrangement of the catadioptric optical system according to the present invention. FIG. 18 is a plan view showing a field on the reticle R of the catadioptric optical system in FIG. 17.

The lens arrangement (second lens arrangement) of the lens groups shown in FIG. 17 will be described. The forward lens group $G_{13F}$ comprises a biconvex positive lens component $L_{131}$. The rear lens group $G_{13R}$ comprises a biconcave negative lens component $L_{132}$. The first optical element group $G_{11}$ comprises a meniscus negative lens component $L_{111}$ with a convex surface facing the reticle R side, a meniscus positive lens component $L_{112}$ with a concave surface facing the reticle R side, an almost plano-convex positive lens component $L_{113}$, and a biconvex positive lens component $L_{114}$, in this order from the reticle R side. The second optical element group $G_{12}$ comprises a meniscus negative lens component $L_{121}$ with a convex surface facing the reticle R side, a meniscus negative lens component $L_{122}$ with a concave surface facing the reticle R side, and a concave mirror $M_1$ with a concave surface facing the reticle R side, in this order from the reticle R.

The first imaging optical system $G_1$ is constituted by the first optical element group $G_{11}$, the second optical element component $G_{12}$, the forward lens group $G_{13F}$, and the rear lens group $G_{13R}$ to form an intermediate image between the first optical element group $G_{11}$ and the rear lens group $G_{13R}$. The third optical element group $G_{13}$ is constituted by the forward lens group $G_{13F}$ and the rear lens group $G_{13R}$.

The front optical element group $G_{21}$ comprises, in the following order from the intermediate image side, a biconcave negative lens component $L_{211}$ with a strong concave surface facing the substrate side, a biconvex positive lens component $L_{212}$, a biconcave negative lens component $L_{213}$, a biconvex positive lens component $L_{214}$, a meniscus positive lens component $L_{215}$ with a convex surface facing the intermediate image side, an almost plano-convex positive lens component $L_{216}$, and a biconvex positive lens component $L_{217}$.

The rear optical element group $G_{22}$ comprises, in the following order from the intermediate image side, a biconvex positive lens component $L_{221}$ having a strong convex surface facing the intermediate image side, a meniscus positive lens component $L_{222}$ with a convex surface facing the intermediate image side, a meniscus negative lens component $L_{223}$ with a convex surface facing the intermediate image side, a meniscus positive lens component $L_{224}$ with a convex surface facing the intermediate image side, a meniscus positive lens component $L_{225}$ with a concave surface facing the intermediate image side, a biconcave negative lens component $L_{226}$, a meniscus negative lens component $L_{227}$ with a convex surface facing the intermediate image side, and a meniscus positive lens component $L_{228}$ with a convex surface facing the intermediate image side.

The numerical data of the second numerical example is shown in Table 2. In this example, the magnification of the overall system is x¼ (reduction), and the numerical aperture NA on the substrate W side is 0.6. As shown in FIG. 18, this example has a rectangular field at an object height of 16 to 72 from the optical axis AX on the reticle R. Scanning exposure can be performed in this field. The unit of the object height coincides with the unit of the distance d or $d_0$.

In the embodiment shown in Table 2, the optical path deflecting mirror $M_2$ is positioned at the 5th and 35th surfaces. In Table 2, the concave mirror $M_1$ corresponds to the 21th surface, and its virtual plane corresponds to the 20th surface.

TABLE 2

$d0 = 70.000$

| | r | d | n |
|---|---|---|---|
| 1 | 290.273 | 35.000 | CaF2 |
| 2 | −674.162 | 39.352 | |
| 3 | −506.467 | 20.000 | SiO2 |
| 4 | 498.954 | 58.525 | |
| 5 | 0.000 | 0.000 | |
| 6 | 0.000 | 60.913 | |
| 7 | 271.026 | 30.000 | SiO2 |
| 8 | 229.361 | 50.000 | |
| 9 | −180.066 | 27.020 | SiO2 |
| 10 | −202.182 | 39.804 | |
| 11 | 19092.913 | 32.234 | SiO2 |
| 12 | −896.703 | 24.223 | |
| 13 | 430.839 | 46.073 | CaF2 |
| 14 | −2665.159 | 8.252 | |
| 15 | 616.588 | 40.000 | SiO2 |
| 16 | 280.652 | 476.053 | |
| 17 | 0.000 | 156.162 | |
| 18 | −304.614 | 20.000 | SiO2 |
| 19 | −1074.964 | 20.000 | |
| 20 | 0.000 | 0.000 | Virtual plane |
| 21 | 471.586 | 20.000 | |
| 22 | 1074.964 | 20.000 | SiO2 |
| 23 | 304.614 | 156.162 | |
| 24 | 0.000 | 476.053 | |
| 25 | −280.652 | 40.000 | SiO2 |
| 26 | −616.588 | 8.252 | |
| 27 | 2665.159 | 46.073 | CaF2 |
| 28 | −430.839 | 24.223 | |
| 29 | 896.703 | 32.234 | SiO2 |
| 30 | −19092.913 | 39.804 | |
| 31 | 202.182 | 27.020 | SiO2 |
| 32 | 180.066 | 50.000 | |
| 33 | −229.361 | 30.000 | SiO2 |
| 34 | −271.026 | 60.913 | |
| 35 | 0.000 | 0.000 | |
| 36 | 0.000 | 58.525 | |
| 37 | −5741.394 | 20.000 | SiO2 |
| 38 | 313.761 | 0.100 | |
| 39 | 263.813 | 55.000 | CaF2 |
| 40 | −199.509 | 5.000 | |
| 41 | −198.081 | 20.000 | SiO2 |
| 42 | 298.298 | 5.000 | |
| 43 | 359.536 | 50.000 | CaF2 |
| 44 | −518.415 | 0.090 | |
| 45 | 334.348 | 40.000 | SiO2 |
| 46 | 357.165 | 204.354 | |
| 47 | 37330.828 | 50.416 | SiO2 |
| 48 | −854.546 | 0.090 | |
| 49 | 1110.031 | 50.000 | SiO2 |
| 50 | −2829.652 | 675.723 | |
| 51 | 0.000 | 100.510 | |
| 52 | 540.067 | 50.000 | SiO2 |
| 53 | −7370.455 | 1.000 | |
| 54 | 235.150 | 50.000 | SiO2 |
| 55 | 1899.379 | 1.000 | |
| 56 | 502.120 | 40.000 | SiO2 |
| 57 | 564.992 | 1.000 | |
| 58 | 207.430 | 60.000 | CaF2 |
| 59 | 734.637 | 10.000 | |
| 60 | −2305.405 | 30.000 | SiO2 |
| 61 | −1231.005 | 5.000 | |
| 62 | −972.253 | 20.000 | SiO2 |
| 63 | 343.658 | 0.100 | |
| 64 | 175.595 | 40.000 | SiO2 |
| 65 | 80.950 | 7.000 | |
| 66 | 77.660 | 50.000 | CaF2 |
| 67 | −1440.669 | 15.000 | |
| 68 | 0.000 | 0.000 | |

The condition correspondence values are as follows:

(1) $|\beta 1|=0.79407$
(2) $|\beta 2|=0.30650$
(3) $|\beta 1 \cdot \beta 2|=0.25$ (4) |PG1+PG2|=0.00000
(6) PG12=−0.00578
(7) PG11+PG21+PG22+PG13=4.985×10$^{-3}$
(8) |rA|/rB=1.085
(9) f11/f12=2.57
(10) |f21|/f22=2.98
(11) f13F/f13R=−0.919

FIGS. 19A–19C are graphs showing the longitudinal aberration of the second numerical example. FIG. 20 is a graph showing the chromatic aberration of magnification of the second numerical example. FIGS. 21A–21E are graphs showing the transverse aberration of the second numerical example. In these graphs, NA represents the numerical aperture, and Y represents the image height. Symbols J, K, and L represent wavelengths of 193.0 nm, 192.9 nm, and 193.1 nm, respectively. In the graph showing spherical aberration shown in FIGS. 19A–19C, a dashed line indicates a sine condition transgression amount. In the graph showing astigmatism, a dashed line indicates the meridional image surface, and a solid line indicates the sagittal image surface. In the graph showing transverse shown in FIGS. 21A–21E, a number above each coma represents the object height.

As is apparent from the various aberrations shown in FIGS. 19A to 21E, in this numerical example, the aberrations are satisfactorily corrected in a wide range in spite of a large numerical aperture NA, 0.6. In addition, as is apparent from the various aberrations shown in FIGS. 19A to 21E, in this numerical example, the on-axis and chromatic aberration of magnifications are also satisfactorily corrected in a wavelength width range of 0.1 nm.

Third Numerical Example

Figure 22:
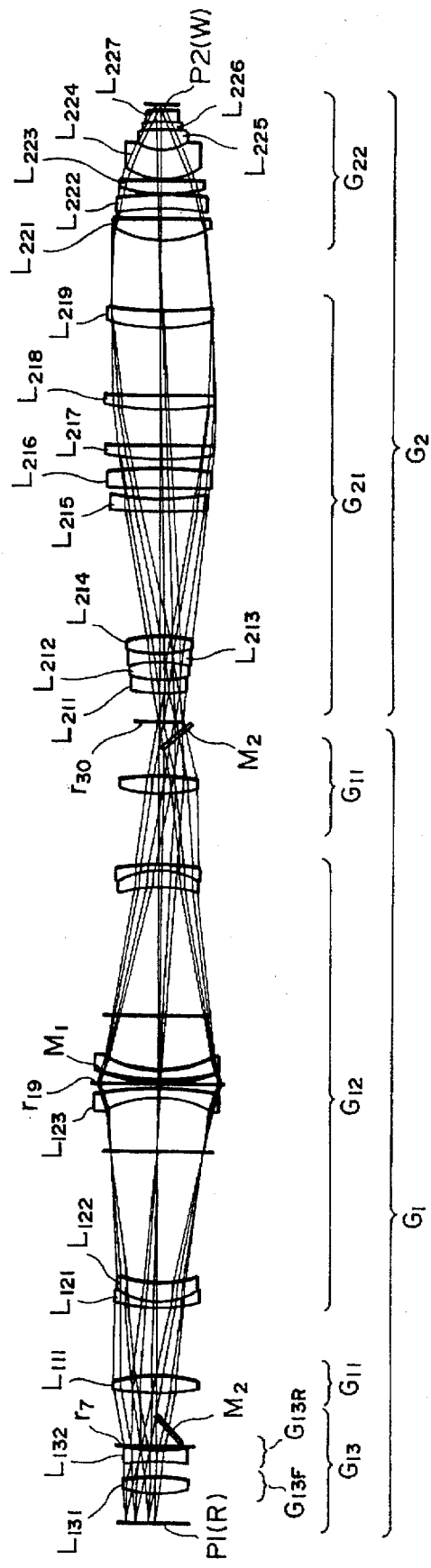
FIG. 22 is a view of a developed optical path formed by the third lens arrangement in the catadioptric optical system according to the present invention.
Figure 23:
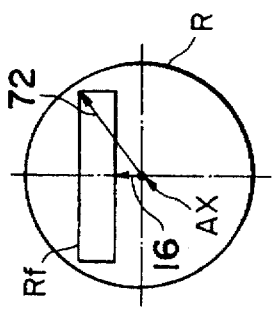
FIG. 23 is a view showing the reticle surface viewed from the illumination optical system side.
Figure 26A:
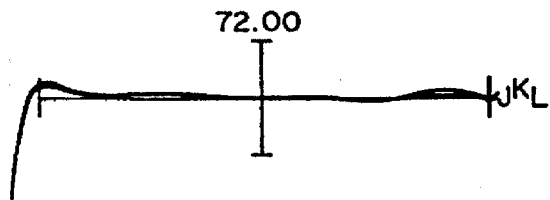
Figure 26B:
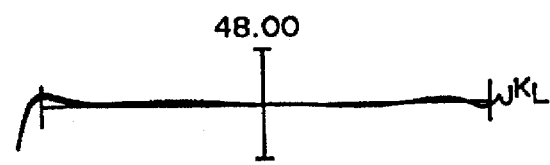
Figure 26C:
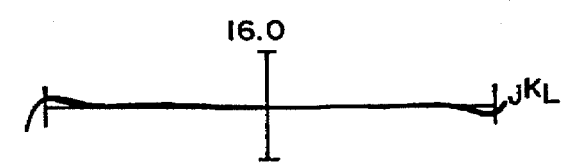
Figure 26D:
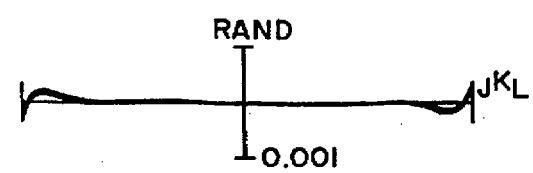
Figure 26E:
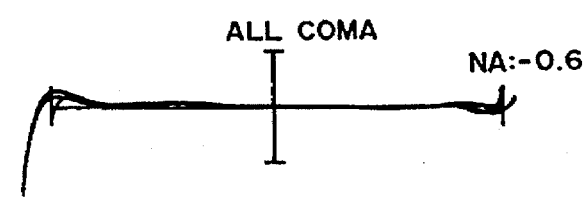

The third numerical example according to the present invention, for example the arrangement shown in FIG. 3, will be described with reference to FIGS. 22 and 23. FIG. 22 is an optical path development showing the third lens arrangement of the catadioptric optical system according to the present invention. FIG. 23 is a plan view showing a field on the reticle R of the catadioptric optical system in FIG. 22.

The lens arrangement (third lens arrangement) of the lens groups shown in FIG. 22 will be described. The forward lens group $G_{13F}$ comprises a biconvex positive lens component $L_{131}$. The rear lens group $G_{13R}$ comprises a biconcave negative lens component $L_{132}$. The first optical element group $G_{11}$ comprises a biconvex positive lens component $L_{111}$. The second optical element group $G_{12}$ comprises, in the following order from the reticle R side, a meniscus negative lens component $L_{121}$ with a convex surface facing the reticle R side, a meniscus positive lens component $L_{122}$ with a convex surface facing the reticle R side, a meniscus negative lens component $L_{123}$ with a concave surface facing the reticle R side, and a concave mirror $M_1$ with a concave surface facing the reticle R side.

The first imaging optical system $G_1$ is constituted by the first optical element group $G_{11}$, the second optical element component $G_{12}$, the forward lens group $G_{13F}$, and the rear lens group $G_{13R}$. The third optical element group $G_{13}$ is constituted by the forward lens group $G_{13F}$ and the rear lens group $G_{13R}$. The first imaging optical system $G_1$ forms an intermediate image of the reticle R in the optical path between the first optical element group $G_{11}$ and the rear lens group $G_{13R}$.

The front optical element group $G_{21}$ comprises, in the following order from the intermediate image side, a meniscus negative lens component $L_{211}$ with a convex surface facing the intermediate image side, a biconvex positive lens component $L_{212}$, a biconcave negative lens component $L_{213}$, a biconvex positive lens component $L_{214}$, a meniscus negative lens component $L_{215}$ with a convex surface facing the intermediate image side, a biconvex positive lens component $L_{216}$, a biconvex positive lens component $L_{217}$, a meniscus positive lens component $L_{218}$ with a convex surface facing the intermediate image side, and a meniscus positive lens component $L_{219}$ with a convex surface facing the intermediate image side.

The rear optical element group $G_{22}$ comprises, in the following order from the intermediate image side, a meniscus positive lens component $L_{221}$ with a convex surface facing the intermediate image side, a meniscus negative lens component $L_{222}$ with a concave surface facing the intermediate image side, a meniscus positive lens component $L_{223}$ with a convex surface facing the intermediate image side, a meniscus negative lens component $L_{224}$ with a convex surface facing the intermediate image side, a meniscus positive lens component $L_{225}$ with a convex surface facing the intermediate image side, a biconcave negative lens component $L_{226}$, and a plano-convex positive lens component $L_{227}$.

The numerical data of the third numerical example is shown in Table 3. In this embodiment, the magnification of the overall system is x¼ (reduction), and the numerical aperture NA on the substrate W side is 0.6. As shown in FIG. 23, this example has a rectangular field at an object height of 16 to 72 from the optical axis AX on the reticle R. Scanning exposure can be performed in this field. The unit of the object height coincides with the unit of the distance d or $d_0$.

In the embodiment shown in Table 3, the optical path deflecting mirror $M_2$ is positioned at the 7th and 30th surfaces. In Table 3, the concave mirror $M_1$ corresponds to the 20th surface, and its virtual plane corresponds to the 19th surface.

TABLE 3 d0 = 70.000

| | r | d | n |
|---|---|---|---|
| 1 | 287.144 | 40.000 | CaF2 |
| 2 | −654.578 | 37.388 | |
| 3 | −468.588 | 0.000 | |
| 4 | 0.000 | 0.000 | |
| 5 | 0.000 | 30.000 | SiO2 |
| 6 | 287.602 | 0.000 | |
| 7 | 0.000 | 0.000 | |
| 8 | 0.000 | 0.000 | |
| 9 | 0.000 | 142.483 | |
| 10 | 857.263 | 40.000 | CaF2 |
| 11 | −432.301 | 180.698 | |
| 12 | 435.998 | 15.054 | SiO2 |
| 13 | 189.589 | 0.582 | |
| 14 | 190.208 | 44.370 | CaF2 |
| 15 | 332.634 | 330.473 | |
| 16 | 0.000 | 143.018 | |
| 17 | −260.582 | 18.637 | SiO2 |
| 18 | −871.619 | 12.373 | |
| 19 | 0.000 | 0.000 | Virtual plane |
| 20 | 403.741 | 12.373 | |
| 21 | 871.619 | 18.637 | SiO2 |
| 22 | 260.582 | 143.018 | |
| 23 | 0.000 | 330.473 | |
| 24 | −332.634 | 44.370 | CaF2 |
| 25 | −190.208 | 0.582 | |
| 26 | −189.589 | 15.054 | SiO2 |
| 27 | −435.998 | 180.698 | |
| 28 | 432.301 | 40.000 | CaF2 |

TABLE 3-continued d0 = 70.000

| | r | d | n |
|---|---|---|---|
| 29 | −857.263 | 142.483 | |
| 30 | 0.000 | 0.000 | |
| 31 | 0.000 | 70.000 | |
| 32 | 629.618 | 31.363 | SiO2 |
| 33 | 233.002 | 2.276 | |
| 34 | 287.383 | 42.592 | CaF2 |
| 35 | −463.496 | 4.510 | |
| 36 | −270.938 | 19.747 | SiO2 |
| 37 | 412.821 | 0.100 | |
| 38 | 330.735 | 40.000 | CaF2 |
| 39 | −472.146 | 318.760 | |
| 40 | 2677.458 | 31.408 | SiO2 |
| 41 | 688.500 | 25.291 | |
| 42 | 4988.430 | 50.510 | SiO2 |
| 43 | −1637.698 | 28.900 | |
| 44 | 1228.746 | 31.614 | SiO2 |
| 45 | −7885.189 | 90.532 | |
| 46 | 758.557 | 35.419 | SiO2 |
| 47 | 7544.784 | 165.679 | |
| 48 | 529.077 | 46.464 | SiO2 |
| 49 | 1873.024 | 72.938 | |
| 50 | 0.000 | 94.928 | |
| 51 | 244.291 | 52.000 | SiO2 |
| 52 | 1787.759 | 30.111 | |
| 53 | −550.963 | 27.000 | SiO2 |
| 54 | −1507.410 | 1.000 | |
| 55 | 333.138 | 37.000 | SiO2 |
| 56 | 14215.066 | 1.000 | |
| 57 | 159.422 | 69.511 | SiO2 |
| 58 | 111.897 | 6.929 | |
| 59 | 124.699 | 40.000 | CaF2 |
| 60 | 526.178 | 6.431 | |
| 61 | −1849.537 | 18.000 | SiO2 |
| 62 | 1103.833 | 0.100 | |
| 63 | 243.096 | 30.000 | SiO2 |
| 64 | 0.000 | 15.000 | |

The condition correspondence values are as follows:

(1) $|\beta 1|=0.84828$
(2) $|\beta 2|=0.30454$
(3) $|\beta 1.\beta 2|=0.25$
(4) $|PG1+PG2|=0.00000$
(6) $PG12=-0.624$
(7) $PG11+PG21+PG22+PG13=6.36\times 10^{-3}$
(8) $|rA|/rB=0.784$
(9) $f11/f12=2.29$
(10) $|f21|/f22=3.01$
(11) $f13F/f13R=-1.287$ FIGS. 24A–24C are graphs showing the longitudinal aberration of the third numerical example. FIG. 25 is a graph showing the chromatic aberration of magnification of the third numerical example. FIGS. 26A–26E are graphs showing the transverse aberration of the third numerical example. In these graphs, NA represents the numerical aperture, and Y represents the image height. Symbols J, K, and L represent wavelengths of 193.0 nm, 192.9 nm, and 193.1 nm, respectively. In the graph showing spherical aberration shown in FIGS. 24A–24C, a dashed line indicates the sine condition transgression amount. In the graph showing astigmatism, a dashed line indicates the meridional image surface, and a solid line indicates the sagittal image surface. In the graph showing transverse aberration shown in FIGS. 26A–26E, a number above each coma represents the object height.

As is apparent from the various aberrations shown in FIGS. 24A to 26E, in this numerical example, the aberrations are satisfactorily corrected in a wide range in spite of a large numerical aperture NA, 0.6. In addition, as is apparent from the various aberrations shown in FIGS. 24A to 26E, in this numerical example, the on-axis and chromatic aberration of magnifications are also satisfactorily corrected in a wavelength width range of 0.1 nm.

Fourth Numerical Example

Figure 27:
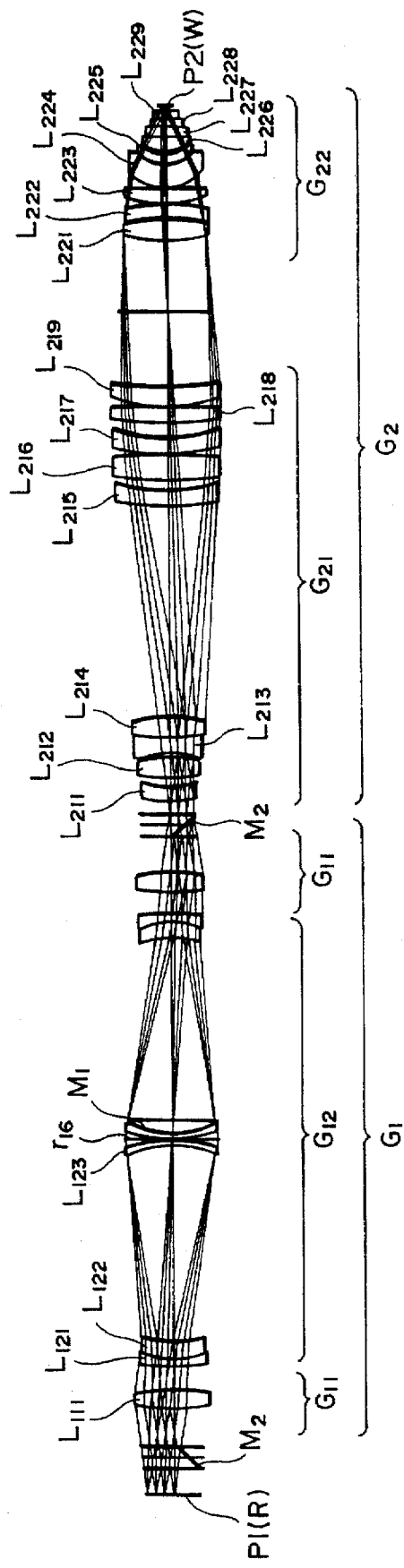
FIG. 27 is a view of the developed optical path formed by the third lens arrangement in the catadioptric optical system according to the present invention.
Figure 28:
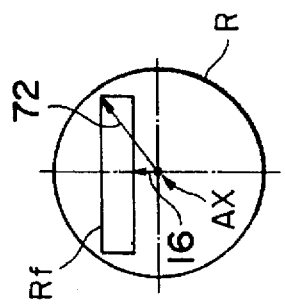
FIG. 28 is a view showing the reticle surface viewed from the illumination optical system side.

The fourth numerical example according to the present invention, for example the arrangement shown in FIG. 3, will be described with reference to FIGS. 27 and 28. FIG. 27 is an optical path development showing the fourth lens arrangement of the catadioptric optical system according to the present invention. FIG. 28 is a plan view showing a field on the reticle R of the catadioptric optical system in FIG. 27.

In the lens arrangement (fourth lens arrangement) of the fourth numerical example in FIG. 27, the first imaging optical system $G_1$ is constituted by the first optical element group $G_{11}$ and the second optical element group $G_{12}$, unlike the lens arrangements of the catadioptric optical systems of the first to third numerical examples. That is, the first imaging optical system $G_1$ does not include the third optical element group $G_{13}$. The lens arrangement (fourth lens arrangement) of the lens groups will be described below with reference to FIG. 27. The first optical element group $G_{11}$ comprises a biconvex positive lens component $L_{111}$. The second optical element group $G_{12}$ comprises, in the following order from the reticle R, a meniscus negative lens component $L_{121}$ with a convex surface facing the reticle R side, a meniscus positive lens component $L_{122}$ with a convex surface facing the reticle R side, a meniscus negative lens component $L_{123}$ with a concave surface facing the reticle R side, and a concave mirror $M_1$ with a concave surface facing the reticle R side.

In this numerical example, the first imaging optical system $G_1$ for forming an intermediate image of the reticle R is constituted by the first optical element group $G_{11}$ and the second optical element component $G_{12}$. The second imaging optical system $G_2$ for refocusing the intermediate image is constituted by the front optical element group $G_{21}$ and the rear optical element group $G_{22}$ (to be described later).

The front optical element group $G_{21}$ comprises, in the following order from the intermediate image side, a meniscus negative lens component $L_{211}$ with a convex surface facing the intermediate image side, a biconvex positive lens component $L_{212}$, a biconcave negative lens component $L_{213}$ with a strong concave surface facing the intermediate image side, a biconvex positive lens component $L_{214}$, a meniscus negative lens component $L_{215}$ with a convex surface facing the intermediate image side, a biconvex positive lens component $L_{216}$, a meniscus negative lens component $L_{217}$ with a convex surface facing the intermediate image side, a biconvex positive lens component $L_{218}$, and a meniscus positive lens component $L_{219}$ with a convex surface facing the intermediate image side.

The rear optical element group $G_{22}$ comprises, in the following order from the intermediate image side, a biconvex positive lens component $L_{221}$, a meniscus negative lens component $L_{222}$ with a concave surface facing the intermediate image side, a meniscus positive lens component $L_{223}$ with a convex surface facing the intermediate image side, a meniscus negative lens component $L_{224}$ with a convex surface facing the intermediate image side, a meniscus positive lens component $L_{225}$ with a convex surface facing the intermediate image side, a biconvex positive lens component $L_{226}$ with a strong convex surface facing the intermediate image side, a biconcave negative lens component $L_{227}$, a biconvex positive lens component $L_{228}$, and a meniscus positive lens component $L_{229}$ with a convex surface facing the intermediate image side.

The numerical data of the fourth numerical example is shown in Table 4. In this example, the magnification of the overall system is x¼ (reduction), and the numerical aperture NA on the substrate W side is 0.6. As shown in FIG. 28, this example has a rectangular field at an object height of 16 to 72 from the optical axis AX on the reticle R. Scanning exposure can be performed in this field. The unit of the object height coincides with the unit of the distance d or $d_0$.

In the embodiment shown in Table 4, the optical path deflecting mirror $M_2$ is positioned at the 2nd to 6th surfaces and the 27th to 32th surfaces. In Table 4, the concave mirror $M_1$ corresponds to the 17th surface, and its virtual plane corresponds to the 16th surface.

TABLE 4 d0 = 70.000

| | r | d | n |
|---|---|---|---|
| 1 | 0.000 | 0.000 | |
| 2 | 0.000 | 30.000 | |
| 3 | 0.000 | 0.000 | |
| 4 | 0.000 | 30.000 | |
| 5 | 0.000 | 0.000 | |
| 6 | 0.000 | 100.790 | |
| 7 | 346.864 | 52.255 | CaF2 |
| 8 | −843.918 | 65.415 | |
| 9 | 842.334 | 14.930 | SiO2 |
| 10 | 171.613 | 7.187 | |
| 11 | 180.001 | 44.004 | CaF2 |
| 12 | 273.777 | 507.678 | |
| 13 | 0.000 | 37.538 | |
| 14 | −264.911 | 8.883 | SiO2 |
| 15 | −741.422 | 6.271 | |
| 16 | 0.000 | 0.000 | Virtual plane |
| 17 | 399.167 | 6.271 | |
| 18 | 741.422 | 8.883 | SiO2 |
| 19 | 264.911 | 37.538 | |
| 20 | 0.000 | 507.678 | |
| 21 | −273.777 | 44.004 | CaF2 |
| 22 | −180.001 | 7.187 | |
| 23 | −171.613 | 14.930 | SiO2 |
| 24 | −842.334 | 65.415 | |
| 25 | 843.918 | 52.255 | CaF2 |
| 26 | −346.864 | 100.790 | |
| 27 | 0.000 | 0.000 | |
| 28 | 0.000 | 30.000 | |
| 29 | 0.000 | 0.000 | |
| 30 | 0.000 | 30.000 | |
| 31 | 0.000 | 0.000 | |
| 32 | 0.000 | 37.709 | |
| 33 | 327.889 | 42.768 | SiO2 |
| 34 | 248.377 | 20.885 | |
| 35 | 475.811 | 58.080 | CaF2 |
| 36 | −645.067 | 19.800 | |
| 37 | −221.930 | 39.600 | SiO2 |
| 38 | 935.365 | 1.320 | |
| 39 | 689.913 | 55.440 | CaF2 |
| 40 | −261.883 | 593.356 | |
| 41 | 1021.854 | 42.829 | SiO2 |
| 42 | 496.092 | 30.413 | |
| 43 | 1373.015 | 68.878 | SiO2 |
| 44 | −3437.700 | 0.086 | |
| 45 | 618.452 | 43.110 | SiO2 |
| 46 | 439.905 | 42.443 | |
| 47 | 733.511 | 48.299 | SiO2 |
| 48 | 10489.054 | 0.086 | |
| 49 | 484.197 | 55.000 | SiO2 |
| 50 | 1248.088 | 206.685 | |
| 51 | 0.000 | 187.633 | |
| 52 | 523.727 | 56.562 | CaF2 |
| 53 | −625.607 | 11.000 | |
| 54 | −440.960 | 29.869 | SiO2 |

TABLE 4-continued d0 = 70.000

| | r | d | n |
|---|---|---|---|
| 55 | −566.474 | 0.452 | |
| 56 | 368.348 | 40.255 | CaF2 |
| 57 | 1061.563 | 0.324 | |
| 58 | 129.430 | 62.684 | SiO2 |
| 59 | 92.503 | 4.689 | |
| 60 | 98.755 | 24.414 | CaF2 |
| 61 | 99.189 | 11.310 | |
| 62 | 107.296 | 38.110 | CaF2 |
| 63 | −8859.947 | 2.066 | |
| 64 | −462.724 | 19.779 | SiO2 |
| 65 | 206.121 | 1.693 | |
| 66 | 137.000 | 26.816 | CaF2 |
| 67 | −579.493 | 1.986 | |
| 68 | 448.260 | 18.758 | CaF2 |
| 69 | 4288.596 | 15.000 | |
| 70 | 0.000 | 0.000 | |

Figure 29A:
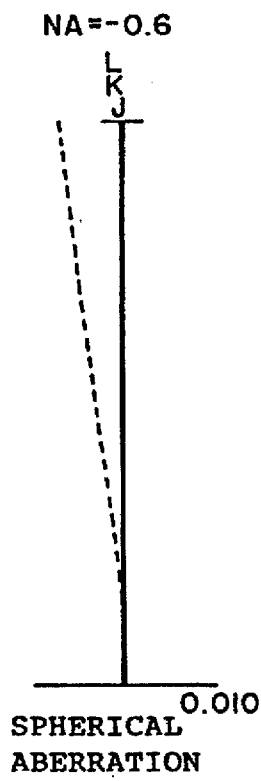
FIGS. 29A to 31E are graphs showing various aberrations in the catadioptric optical system shown in FIG. 27.
Figure 29B:
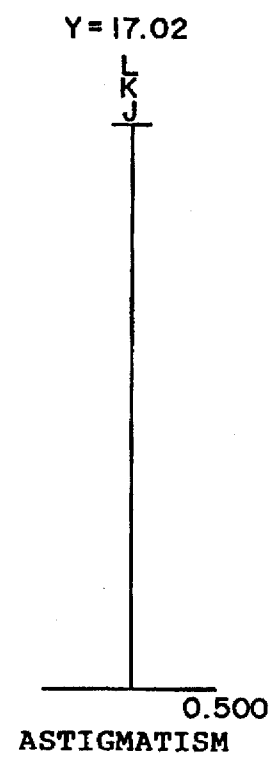
Figure 29C:
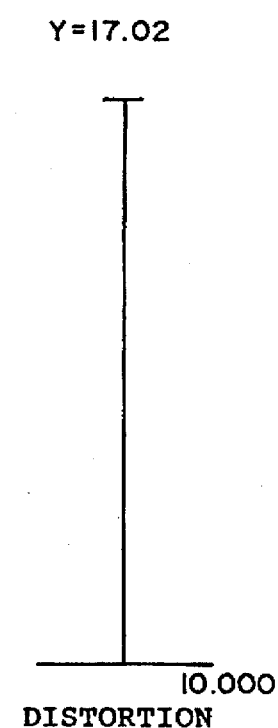
Figure 30:
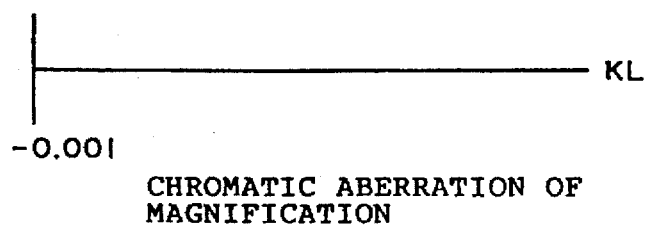
Figure 31A:
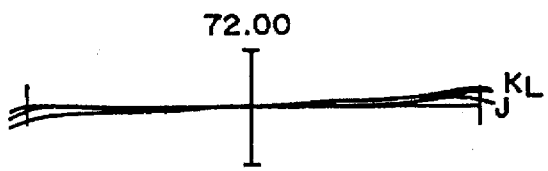
Figure 31B:
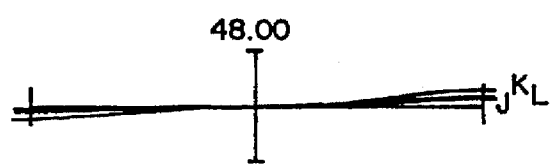
Figure 31C:
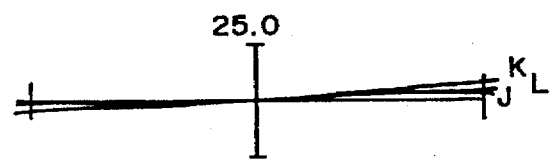
Figure 31D:
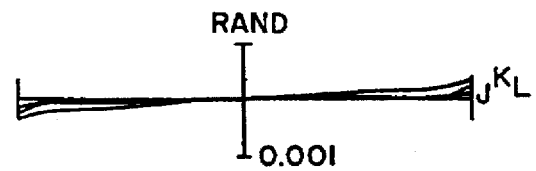
Figure 31E:
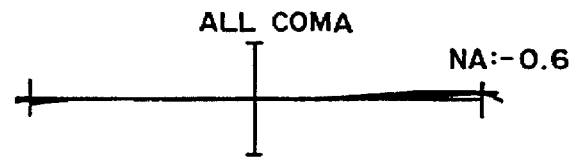

The condition correspondence values are as follows:

(1) $|\beta 1|=-0.96537$
(2) $|\beta 2|=-0.24387$
(3) $|\beta 1.\beta 2|=0.25$
(4) $|PG1+PG2|=0.00000$
(5) $PG11+PG21+PG22=7.45\times 10^{-3}$
(6) $PG12=-0.00691$
(7) 
(8) $|rA|/rB=0.967$
(9) $f11/f12=2.77$
(10) $|f21|/f22=4.3$ FIGS. 29A–29C are graphs showing the longitudinal aberration of the fourth numerical example. FIG. 30 is a graph showing the chromatic aberration of magnification of the fourth numerical example. FIGS. 31A–31E are graphs showing the transverse aberration of the fourth numerical example. In these graphs, NA represents the numerical aperture, and Y represents the image height. Symbols J, K, and L represents wavelengths of 193.0 nm, 192.9 nm, and 193.1 nm, respectively. In the graph showing spherical aberration shown in FIGS. 29A–29C, a dashed line indicates the sine condition transgression amount. In the graph showing astigmatism, a dashed line indicates the meridional image surface, and a solid line indicates the sagittal image surface. In the graph showing transverse aberration shown in FIGS. 31A–31E, a number above each coma represents the object height.

As is apparent from the various aberrations shown in FIGS. 29A to 31E, in this numerical example, the aberrations are satisfactorily corrected in a wide range in spite of a large numerical aperture NA, 0.6. In addition, as is apparent from the various aberrations shown in FIGS. 29A to 31E, in this numerical example, the on-axis and chromatic aberration of magnifications are also satisfactorily corrected in a wavelength width range of 0.1 nm.

As has been described above, according to each of the above embodiments of the present invention, a catadioptric optical system in which various aberrations are satisfactorily corrected in the wide exposure area Wf in spite of a very large numerical aperture can be provided.

In each of the above embodiments, the diameter of the concave mirror $M_1$ becomes about 250 to 300 to achieve a considerable size reduction of the concave mirror. The unit of the diameter of the concave mirror $M_1$ coincides with the unit of the distance d or $d_0$. As is apparent from the numerical values in each embodiment, a sufficient working distance is ensured.

In each of the above embodiments, the optical path deflecting mirror $M_2$ serving as the first optical path deflecting means is arranged near an intermediate image formed by the first imaging optical system $G_1$. With this arrangement, the influence of a decentering error of the first and second imaging optical systems $G_1$ and $G_2$ with respect to the optical path deflecting mirror $M_2$ can be minimized. In each of the above embodiments, since the diameter of a light beam reaching the reflecting surface of the optical path deflecting mirror $M_2$ is reduced, the optical path deflecting mirror itself can be made compact. Therefore, shielding of a light beam by the optical path deflecting mirror $M_2$ can be minimized to increase the exposure area on the substrate.

In each of the above embodiments, the optical path deflecting mirror $M_2$ is constituted by a surface reflecting mirror. Instead, a back surface reflecting mirror may also be used.

In each of the above embodiments, a light beam from the first imaging optical system $G_1$ is deflected by 90° by the optical path deflecting mirror $M_2$ and thereafter guided to the second imaging optical system $G_2$. With this arrangement, decentering adjustment between the first imaging optical system $G_1$ and the second imaging optical system $G_2$ can be easily performed.

In each of the above embodiments, the aperture stop 6 can be arranged between the front optical element group $G_{21}$ and the rear optical element group $G_{22}$ in the second imaging optical system $G_2$. Therefore, when the aperture stop 6 has a variable aperture diameter, σ variable exposure can also be performed.

The catadioptric optical system according to the first numerical example (FIG. 12) has an zone field. Therefore, only an aberration caused by a predetermined image height need be corrected.

When a beam splitter is used in place of the optical path deflecting mirror $M_2$ of the second to fourth numerical example, one-shot exposure using an object height of 0 to 72 from the optical axis AX on the reticle R can also be performed by the exposure apparatus shown in FIG. 1, as a matter of course.

Figure 36:
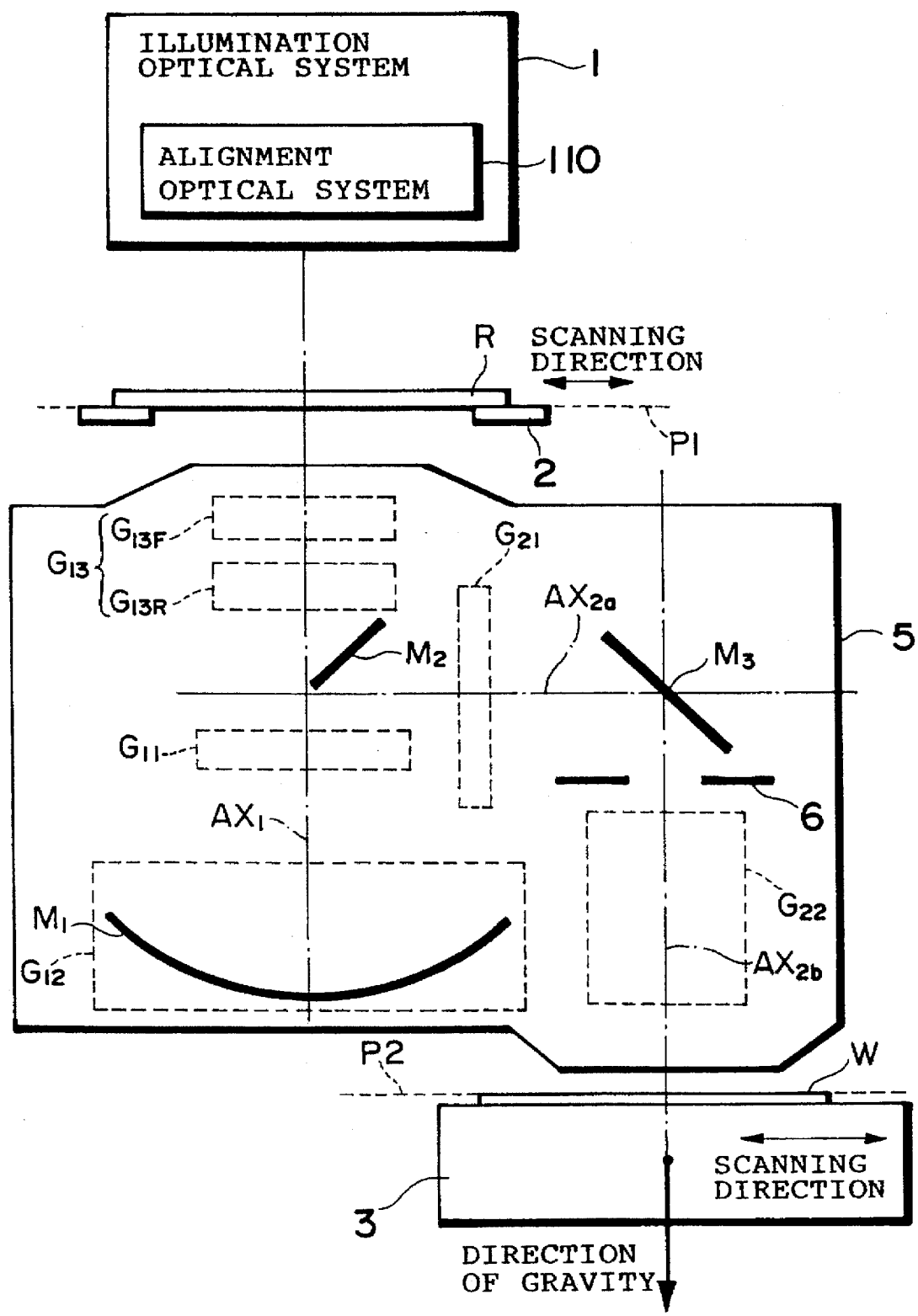
FIG. 36 is a view showing the arrangement of the catadioptric optical system applied to a common exposure apparatus.

Next, for the reference, FIG. 36 shows a common exposure apparatus to which the catadioptric optical system of FIG. 9 is applied. As shown in FIG. 36, the axis $AX_{2b}$ of the second imaging optical system $G_2$, included in a propagation direction of a light beam emerging from said second imaging optical system $G_2$, coincides with a direction of gravity while arranging the first plane P1 and the second plane P2 in parallel to each other.

As has been described above, according to the present invention, a large numerical aperture can be realized, and a size reduction of the diameter of the concave mirror can be achieved while ensuring a sufficient working distance on the image side.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 271631/1994 (6-271631) filed on Nov. 7, 1994, and 047142/1995 (6-047142) are hereby incorporated by reference.

What is claimed is:

1. A catadioptric optical system for forming an image of a pattern on a first plane on a second plane, comprising:

a first imaging optical system for forming an intermediate image of the pattern on the first plane, said first imaging optical system comprising a first optical element group having a positive refracting power, and a second optical element group including a negative lens component and a concave mirror and having a positive refracting power;

a second imaging optical system having a reduction magnification and adapted to form an image of the intermediate image formed by said first imaging optical system onto the second plane, a composite magnification of said second imaging optical system and said first imaging optical system being a reduction magnification; and a first optical path deflecting member arranged in an optical path from said first imaging optical system to said second imaging optical system to guide a light beam from said first imaging optical system to said second imaging optical system, wherein a light beam from the first plane passes through said first optical element group and reaches said concave mirror in said second optical element group, and the light beam reflected by said concave mirror passes through said first optical element group again and reaches said first optical path deflecting member.

2. A system according to claim 1, wherein said first optical path deflecting member is arranged between the first plane and said first optical element group at a position shifted from an optical axis of said first optical element group, and said first optical element group in said first imaging optical system is partially arranged between said first optical path deflecting member and said second optical element group.

3. A system according to claim 1, wherein said negative lens component in said second optical element group has a meniscus shape with a concave surface facing said first optical element group.

4. A system according to claim 1, wherein said second imaging optical system comprises a front optical element group having a positive refracting power and a rear optical element group having a positive refracting power, and a light beam from said first imaging optical system sequentially passes through said front optical element group and said rear optical element group and reaches the second plane.

5. A system according to claim 4, wherein said second imaging optical system further comprises an aperture stop arranged in an optical path between said front optical element group and said rear optical element group.

6. A system according to claim 1, wherein said first imaging optical system further comprises a third optical element group arranged in an optical path between the first plane and said first optical element group, said third optical element group having, in the following order from the first plane to said first optical element group, a forward lens group having a positive refracting power and a rear lens group having a negative refracting power.

7. A system according to claim 6, wherein said second imaging optical system comprises a front optical element group having a positive refracting power and a rear optical element group having a positive refracting power, and a light beam from said first imaging optical system sequentially passes through said front optical element group and said rear optical element group and reaches the second plane.

8. A system according to claim 1, wherein
said first imaging optical system has a reduction magnification.

9. A system according to claim 1, wherein
said catadioptric optical system satisfies the following conditions:

$$0.4 < |\beta_1| < 1.2$$

$$0.2 < |\beta_2| < 0.7$$

$$1/10 < |\beta_1 \cdot \beta_2| < 1/2$$

where $\beta_1$ is the imaging magnification of said first imaging optical system, and $\beta_2$ is the imaging magnification of said second imaging optical system.

10. A system according to claim 1, wherein
each lens component constituting said second imaging optical system essentially consists of one of at least two optical materials having different dispersion values.

11. A system according to claim 4, wherein
said front optical element group in said second imaging optical system includes a negative lens component of high-dispersion glass and a positive lens component of low-dispersion glass, and
said rear optical element group in said second imaging optical system includes a positive lens component of low-dispersion glass.

12. A system according to claim 4, wherein
said catadioptric optical system satisfies the following conditions:

$$|P_{G1} + P_{G2}| < 0.1$$

$$P_{G11} + P_{G21} + P_{G22} > 0$$

$$P_{G12} < 0$$

where
$P_{G1}$: Petzval value of said first imaging optical system,
$P_{G2}$: Petzval value of said second imaging optical system,
$P_{G11}$: Petzval value of said first optical element group in said first imaging optical system,
$P_{G12}$: Petzval value of said second optical element group in said first imaging optical system,
$P_{G21}$: Petzval value of said forward optical element group in said second imaging optical system,
$P_{G22}$: Petzval value of said rear optical element group in said second imaging optical system.

13. A system according to claim 7, wherein said catadioptric optical system satisfies the following conditions:

$$|P_{G1} + P_{G2}| < 0.1$$

$$P_{G11} + P_{G21} + P_{G22} + P_{G13} > 0$$

$$P_{G12} < 0$$

where
$P_{G1}$: Petzval value of said first imaging optical system,
$P_{G2}$: Petzval value of said second imaging optical system,
$P_{G11}$: Petzval value of said first optical element group in said first imaging optical system,
$P_{G12}$: Petzval value of said second optical element group in said first imaging optical system,
$P_{G13}$: Petzval value of said third optical element group in said first imaging optical system,
$P_{G21}$: Petzval value of said forward optical element group in said second imaging optical system,
$P_{G22}$: Petzval value of said rear optical element group in said second imaging optical system.

14. A system according to claim 1, further comprising a second optical path deflecting member arranged in an optical path between the first plane and said first optical element group in said first imaging optical system to change a propagation direction of the light beam from the first plane, whereby the first plane and the second plane are maintained in parallel to each other.

15. A system according to claim 14, wherein
said second optical path deflecting member is arranged between the first plane and said first optical path deflecting member at a position shifted from an optical axis of said first optical element group.

16. A system according to claim 4, further comprising a third optical path deflecting member arranged in an optical path between said front optical element group and said rear optical element group in said second imaging optical system to change a propagation direction of the light beam transmitted through said first imaging optical system and said front optical element group, whereby the first plane and the second plane are maintained in parallel to each other.

17. A system according to claim 1, further comprising a field stop arranged on a plane on which the intermediate image is formed by said first imaging optical system, said field stop changing a size of an image formation area on the second plane.

18. A system according to claim 4, further comprising a filter arranged between said front optical element group and said rear optical element group in said second imaging optical system and adapted to increase a depth of focus.

19. A method of setting said catadioptric optical system, wherein constituent elements constituting said catadioptric optical system of claim 14 are arranged such that a propagation direction of a light beam emerging from said second imaging optical system to the second plane coincides with a direction perpendicular to the direction of gravity while arranging the first plane and the second plane parallel to each other.

20. A method of setting said catadioptric optical system, wherein constituent elements constituting said catadioptric optical system of claim 16 are arranged such that a propagation direction of a light beam emerging from said second imaging optical system to the second plane coincides with a direction of gravity while arranging the first plane and the second plane parallel to each other.

21. A system according to claim 16, wherein said second optical path deflecting member is arranged between the first plane and said first optical path deflecting member at a position shifted from an optical axis of said first optical element group.

22. An exposure apparatus comprising:
a first stage capable of holding a photosensitive substrate on a main surface thereof;
a second stage for holding a mask having a predetermined pattern:
an illumination optical system for irradiating an exposure light beam having a predetermined wavelength to said mask and transferring an image of the predetermined pattern on said mask onto said substrate; and
a catadioptric optical system provided between said first stage and said second stage to project the pattern on said mask onto said substrate, said catadioptric optical system comprising a first imaging optical system for forming an intermediate image of the pattern on said mask, said first imaging optical system comprising a first optical element group having a positive refracting power, and a second optical element group including a negative lens component and a concave mirror and having a positive refracting power, a second imaging optical system having a reduction magnification and adapted to form an image of the intermediate image formed by said first imaging optical system on said substrate, a composite magnification of said second imaging optical system and said first imaging optical system being a reduction magnification, and a first optical path deflecting member arranged in an optical path from said first imaging optical system to said second imaging optical system to guide a light beam from said first imaging optical system to said second imaging optical system, wherein a light beam from said mask passes through said first optical element group and reaches said concave mirror in said second optical element group, and the light beam reflected by said concave mirror passes through said first optical element group again and reaches said first optical path deflecting member.

23. An apparatus according to claim 22, wherein said catadioptric optical system satisfies the following conditions:

$0.4 < |\beta_1| < 1.2$ $0.2 < |\beta_2| < 0.7$ $1/10 < |\beta_1 \cdot \beta_2| < 1/2$ where $\beta_1$ is the imaging magnification of said first imaging optical system, and $\beta_2$ is the imaging magnification of said second imaging optical system.

24. An apparatus according to claim 22, wherein said second imaging optical system comprises a front optical element group having a positive refracting power and a rear optical element group having a positive refracting power, and a light beam from said first imaging optical system sequentially passes through said front optical element group and said rear optical element group and reaches an image plane on said substrate.

25. An apparatus according to claim 24, wherein said catadioptric optical system satisfies the following conditions:

$|P_{G1} + P_{G2}| < 0.1$ $P_{G11} + P_{G21} + P_{G22} > 0$ $P_{G12} < 0$ where $P_{G1}$: Petzval value of said first imaging optical system, $P_{G2}$: Petzval value of said second imaging optical system, $P_{G11}$: Petzval value of said first optical element group in said first imaging optical system, $P_{G12}$: Petzval value of said second optical element group in said first imaging optical system, $P_{G21}$: Petzval value of said forward optical element group in said second imaging optical system, $P_{G22}$: Petzval value of said rear optical element group in said second imaging optical system.

26. An apparatus according to claim 22, wherein said first imaging optical system further comprises a third optical element group arranged in an optical path between said second stage and said first optical element group, said third optical element group having, in the following order from said second stage to said first optical element group, a forward lens group having a positive refracting power and a rear lens group having a negative refracting power.

27. An apparatus according to claim 26, wherein said second imaging optical system comprises a front optical element group having a positive refracting power and a rear optical element group having a positive refracting power, and a light beam from said first imaging optical system sequentially passes through said front optical element group and said rear optical element group and reaches an image plane on said substrate.

28. An apparatus according to claim 27, wherein said catadioptric optical system satisfies the following conditions:

$|P_{G1} + P_{G2}| < 0.1$ $P_{G11} + P_{G21} + P_{G22} + P_{G12} > 0$ $P_{G12} < 0$ where $P_{G1}$: Petzval value of said first imaging optical system, $P_{G2}$: Petzval value of said second imaging optical system, $P_{G11}$: Petzval value of said first optical element group in said first imaging optical system, $P_{G12}$: Petzval value of said second optical element group in said first imaging optical system, $P_{G13}$: Petzval value of said third optical element group in said first imaging optical system, $P_{G21}$: Petzval value of said forward optical element group in said second imaging optical system, $P_{G22}$: Petzval value of said rear optical element group in said second imaging optical system.

29. An apparatus according to claims 22, wherein said catadioptric optical system further comprises a second optical path deflecting member arranged in an optical path between said second stage and said first optical element group in said first imaging optical system to change a propagation direction of the light beam from said mask, whereby an object plane on said mask and an image plane on said substrate are maintained in parallel to each other when said substrate is held by said first stage, and said mask is held by said second stage.

30. An apparatus according to claim 29, wherein said second optical path deflecting member is arranged in an optical path between said second stage and said first optical path deflecting member at a position shifted from an optical axis of said first optical element group.

31. An apparatus according to claim 27, further comprising a third optical path deflecting member arranged in an optical path between said front optical element group and said rear optical element group in said second imaging optical system to change a propagation direction of the light beam transmitted through said first imaging optical system and said front optical element group, whereby an object plane on said mask and an image plane on said substrate are maintained in parallel to each other when said substrate is held by said first stage, and said mask is held by said second stage.

32. An apparatus according to claim 29, wherein
said catadioptric optical system is arranged such that a propagation direction of an exposure light beam emitted from said illumination optical system and passing through said mask and a propagation direction of an exposure light beam emerging from said second imaging optical system to an image plane on said substrate coincide with a direction perpendicular to the direction of gravity while an object plane on said mask and the image plane on said substrate are maintained in parallel to each other when said mask is held by said second stage, and said substrate is held by said first stage.

33. An apparatus according to claim 31, wherein
said catadioptric optical system is arranged such that a propagation direction of an exposure light beam emitted from said illumination optical system and passing through said mask and a propagation direction of an exposure light beam emerging from said second imaging optical system to an image plane on said substrate coincide with a direction of gravity while an object plane on said mask and the image plane on said substrate are maintained in parallel to each other when said mask is held by said second stage, and said substrate is held by said first stage.

34. An apparatus according to claim 22, further comprising an excimer laser as a light source for emitting the exposure light beam having a predetermined wavelength.

35. An apparatus according to claim 31, wherein said catadioptric optical system further comprises a second optical path deflecting member arranged in an optical path between said second stage and said first optical element group in said first imaging optical system to change a propagation direction of the light beam from said mask, whereby an object plane on said mask and an image plane on said substrate are maintained in parallel to each other when said substrate is held by said first stage, and said mask is held by said second stage.

* * * * *